(12) United States Patent
Piret et al.

(10) Patent No.: US 6,766,489 B1
(45) Date of Patent: Jul. 20, 2004

(54) DEVICE AND METHOD OF ADAPTING TURBOCODERS AND THE ASSOCIATED DECODERS TO SEQUENCES OF VARIABLE LENGTH

(75) Inventors: Philippe Piret, Cesson-Sevigne (FR); Claude Le Dantec, Saint Hilaire des Landes (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/435,351

(22) Filed: Nov. 8, 1999

(30) Foreign Application Priority Data

Nov. 9, 1998 (FR) .............................. 98 14085

(51) Int. Cl.$^7$ .............................................. H03M 13/00
(52) U.S. Cl. ...................................... 714/755; 714/781
(58) Field of Search ................................ 714/781, 782, 714/783, 784, 755, 758, 752

(56) References Cited

U.S. PATENT DOCUMENTS

| | | | | |
|---|---|---|---|---|
| 5,416,797 A | * | 5/1995 | Gilhousen et al. | .......... 370/209 |
| 5,727,062 A | | 3/1998 | Ritter | ......................... 380/37 |
| 5,745,503 A | * | 4/1998 | Kuusinen | .................... 714/752 |
| 5,978,365 A | | 11/1999 | Yi | |

FOREIGN PATENT DOCUMENTS

| | | |
|---|---|---|
| EP | 0555998 | 8/1993 |
| EP | 0566215 | 10/1993 |
| EP | 0588307 A | 3/1994 |
| EP | 0735775 A | 10/1996 |
| EP | 0928071 | 7/1999 |
| FR | 2773287 | 7/1999 |

OTHER PUBLICATIONS

Barbulescu, A. S., et al., "Terminating the Trellis of Turbo–Codes in the Same State", Electronics Letters, 1995, vol. 31, No. 1, pp. 22–23.

Barbulescu, A. S., et al., "Interleaver Design for Turbo Codes", Electronics Letters, 1994, vol. 30, No. 25, pp. 2107–2108.

* cited by examiner

Primary Examiner—Christine T. Tu
(74) Attorney, Agent, or Firm—Fitzpatrick, Cella, Harper & Scinto

(57) ABSTRACT

The coding method to which the present invention relates takes into account at least one selection criterion related to a transmission of binary symbols representing a physical quantity, for selecting at least one transmission parameter.

Figure 1:
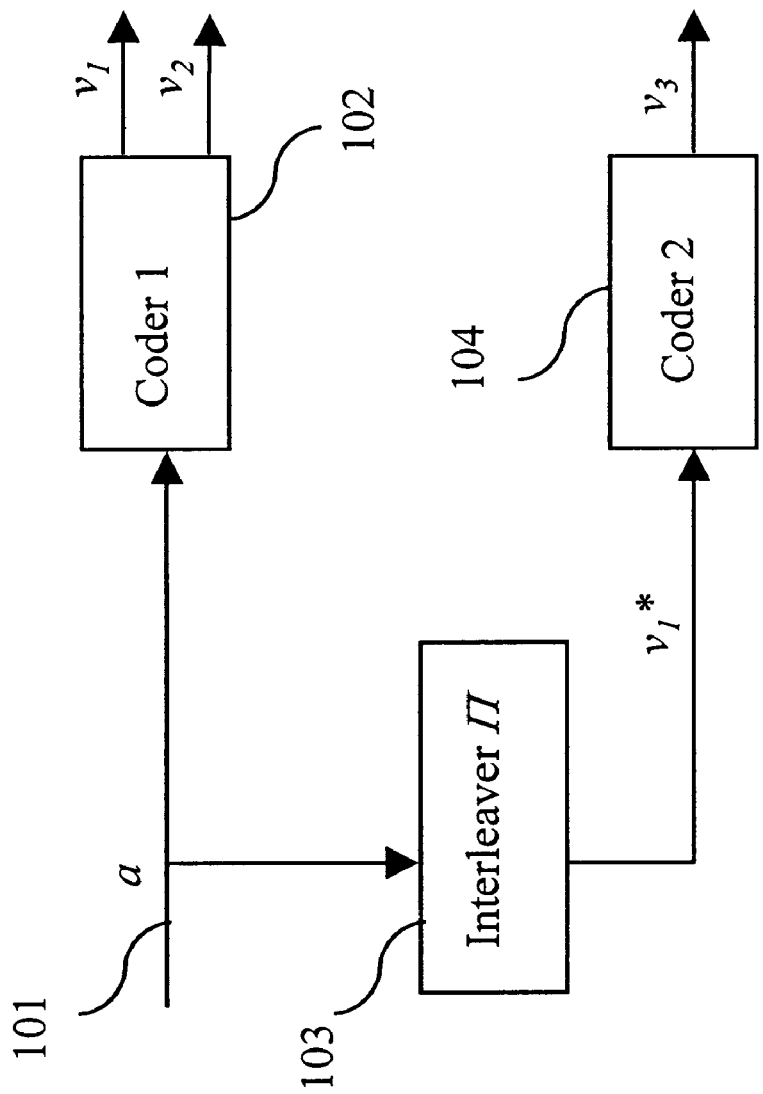

Each said selected transmission parameter is in the set of parameters comprising:
  a number K, greater than or equal to 1, of sequences $a_i$ (i=1, . . . , K) of binary symbols, to be coded,
  an integer M1, equal to or greater than 2,
  a divisor polynomial $g_i(x)$,
  an integer M,
  an interleaver, and
  a multiplier polynomial $f_{ij}(x)$.

It uses an interleaver which maintains the divisibility by a polynomial $g_i(x)$.

80 Claims, 14 Drawing Sheets

ROM:
Program
Table of values of $e$ according to the possible values of $n$

RAM:
$n, e$
Generated interleaver $\Pi$
$u, a, a'$
$v_1, v'_1, v_2, v'_2, v_3$
Radio frame to be transmitted

Fig. 7

ROM:
Program
Table of values of $e$ according to the possible values of $n$
Table of values of $e^{-1}$ according to the possible values of $n$

RAM:
$n, e, e^{-1}$
Generated interleavers $\Pi$ and $\Pi^{-1}$
$\underline{u}, \underline{a}, \underline{a}'$
$\underline{v}_1, \underline{v}'_1, \underline{v}_2, \underline{v}'_2, \underline{v}_3$
Received radio frame

Fig. 8

DEVICE AND METHOD OF ADAPTING TURBOCODERS AND THE ASSOCIATED DECODERS TO SEQUENCES OF VARIABLE LENGTH

The present invention concerns a method and a device for adapting turbocoders and the associated decoders to sequences of variable length and systems using them.

It applies equally well to the coding of data representing a physical quantity, to the coding of data in the form of codes capable of modulating a physical quantity, to the decoding of data modulated signals, and to the decoding of data representing physical quantities. These data can, for example, represent images, sounds, computer data, electrical quantities or stored data.

The invention finds an application in the field of convolutional codes. When the latter are used for implementing an iterative decoding, these codes are greatly improved when their coders contain a permutation device. In this case, they are usually referred to as "turbocodes" and the corresponding iterative decoder is referred to as a "turbodecoder".

On these subjects, documents which serve as references are, on the one hand, the article by Messrs. C. BERROU, A. GLAVIEUX and P. THITIMAJSHIMA entitled "Near Shannon limit error-correcting coding and decoding: turbocodes" published with the reports of the "ICC'93" conference, 1993, pages 1064 to 1070, and, on the other hand, the article by Messrs. C. BERROU and A. GLAVIEUX entitled "Near Optimum error-correcting coding and decoding: turbo-codes" published by IEEE Transactions on Communication, Volume COM-44, pages 1261 to 1271, in October 1996.

However, the formation of the permutation devices is far from being completely mastered. In general, this device uses square or rectangular matrices which are written into one row after another and read from one column after another. These matrices are generally very large, for example 256× 256 in size.

According to another method, in an article entitled "Weight distributions for turbo-codes using random and nonrandom permutations" published by the Jet Propulsion Laboratory, with "TDA Progress Report", number 42-122, on 15 Aug. 1995, Messrs. DOLINAR and DIVSALAR consider the permutations which, numbering the k information item positions between 0 and k−1, move the binary information items placed in a position i to a position e i+f, for "well-chosen" values of e and f.

In this document, they give only one example where k is a power of 2. Moreover, they do not discuss the possible mutual effect of the choice of the permutation device and that of the elementary convolutional coders (2,1) to be used for generating the coded sequences produced by the turbocoder (3,1).

The evaluation of the corresponding turbocode consists of simulating its use on a transmission channel with different values of signal/noise ratio and of measuring the minimum value of this ratio for which a predetermined value of error probability on the binary values is reached.

However, the use of simulations as an evaluation tool can lead to a few problems.

Let, for example, the permutation device with k=65536= 256×256, mentioned above, be considered, and let a predetermined error probability equal to $10^{-5}$ be chosen for simulating the performance of a turbocode using this device. Consequently, the mean number of errors on the binary values per 256×256 block will be close to 1, but it will not be known whether each item of binary information has the same error probability. This error probability could be quite high for binary values having an "unfortunate" position in the permutation device and this probability could be much lower for more "fortunate" positions.

One possible way for remedying this situation is to carry out a harmonious and joint design of the permutation device and the two convolutional coders in order to guarantee a reasonable uniformity of the error rate on the binary values after decoding, according to the position of the binary information in the permutation device.

Another problem concerns the lack of algebraic tools for specifying the permutation devices. It would be useful to have available means making it possible to specify a selection of permutation devices having performances representative of the set of all the permutation devices.

The invention principally concerns the transmission of information represented by sequences of binary symbols:

$$\underline{u}=(u_0,u_1,\ldots,u_{k-1}),$$

referred to as "information sequences", which will be coded into a triplet of binary sequences, $$\underline{v}=(\underline{a},\underline{b},\underline{c}),$$

each of these sequences $\underline{a}$, $\underline{b}$ and $\underline{c}$ being, on its own, representative of the sequence $\underline{u}$.

In the remainder of the description, for representing a sequence $\underline{u}$, the form $\underline{u}=(u_0, u_1, \ldots, u_{k-1})$, and the associated polynomial form:

$$u(x)=u_0x^0+u_1x^1+\ldots+u_{k-1}x^{k-1}$$

are used indiscriminately.

Equivalent notations will be used for the sequences $\underline{a}$, $\underline{b}$ and $\underline{c}$. Using this second representation, the following is known for determining the triplet $\underline{v}=(\underline{a}, \underline{b}, \underline{c})$:

choosing $a(x)=u(x)$;

choosing $b(x)=u(x).h_1(x)/g(x)$, where $g(x)$ is a polynomial, for example $g(x)=1+x+x^3$, corresponding, according to the sequential representation, to the sequence $(1, 1, 0, 1)$; and $h_1(x)$ is a polynomial, for example $h_1(x)=1+x+x^2+x^3$, corresponding to the sequence $(1, 1, 1, 1)$; and referring to as $\underline{a}^*$, a sequence formed by permutation of the binary data items of the sequence $\underline{a}$, choosing $c(x)=a^*(x).h_2(x)/g(x)$ where $h_2(x)$ is a polynomial, for example $h_2(x)=(1+x^2+x^3)$ corresponding to the sequence $(1, 0, 1, 1)$.

Any choice of the polynomials $g(x)$, $h_1(x)$, $h_2(x)$ and of the permutation specifying the interleaver which associates the permuted sequence $\underline{a}^*$ with the sequence $\underline{a}$, specifies a coder which will be referred to as a "turbocoder". The set of sequences which can be produced by a specified turbocoder will be referred to as a "turbocode".

In the remainder of the description, the elementary recursive convolutional coder which produces the sequence $\underline{b}$ is referred to as the "first coder", and the one which produces the sequence $\underline{c}$ is referred to as the "second coder".

The polynomial divisions used are of the division according to ascending powers type, well known to persons skilled in the art. They use modulo 2 arithmetic. The sequences $\underline{a}$, $\underline{b}$ and $\underline{c}$ are binary sequences and in the general case the divisions which define $\underline{b}$ and $\underline{c}$ have a remainder.

This type of coding method has the advantage of lending itself to an effective iterative decoding which is not very complex and not very expensive.

For implementing it, a number of questions arise:

I/ How are the polynomials $g(x)$, $h_1(x)$ and $h_2(x)$ chosen?

II/ How is the permutation of the terms of the sequence $\underline{a}$ which produces the sequence $\underline{a}^*$ chosen? Among the choices proposed, three examples of interleavers, that is to say operators which permute the terms of the sequence $\underline{a}$, in order to form the sequence $\underline{a}^*$, are given below:

A) in the first example, after having arranged the terms of $\underline{a}$ in a rectangular table, successively row by row and, for each row, from left to right, the sequence $\underline{a}^*$ is formed by successively taking, from this table, the terms column after column and, for each column, from top to bottom. For example, in the case of sequences of six terms and the use of a table of two rows of three columns, the interleaver transforms the sequence $\underline{a}=(a_0, a_1, a_2, a_3, a_4, a_5)$ into the sequence $\underline{a}^*=(a_0, a_3, a_1, a_4, a_2, a_5)$.

B) in a second example, the i-th term (i=0, 1, 2, ...) $a^*_i$ of the sequence $\underline{a}^*$ is chosen as being the term $a_j$ of the sequence $\underline{a}$, with $j=s.i+t$ calculated modulo the number of terms in the sequence $\underline{a}$, s and t being integers. For example, if the number of terms in the sequence $\underline{a}$ is six and if s=5 and t=3, the interleaver transforms the sequence $\underline{a}=(a_0, a_1, a_2, a_3, a_4, a_5)$ into the sequence $\underline{a}^*=(a_3, a_2, a_1, a_0, a_5, a_4)$.

C) in the third example, the permutation chosen is random.

III/ How can it be avoided that the division defining $b(x)$ has a remainder? and IV/ How can it be avoided that the division defining $c(x)$ has a remainder?

Answering these last two questions amounts to solving a problem frequently mentioned in the literature on turbocodes which is that of the "return to the zero state" of the elementary convolutional coders defining $\underline{b}$ and $\underline{c}$. Since the turbocoders have two elementary recursive coders, the second of which uses a permutation $\underline{a}^*$ of the sequence $\underline{a}$, it is desired to guarantee that the polynomials $a(x)$ and $a^*(x)$ representing the information sequence $u(x)$ are simultaneously divisible by $g(x)$. Ensuring this condition of divisibility of $a(x)$ is simple since it is sufficient to construct $a(x)$ from $u(x)$ by supplementing $u(x)$ with stuffing symbols, equal in number to the degree of $g(x)$ and the sole function of which is to guarantee the absence of a remainder in the division used to produce $b(x)$ from $a(x)$.

Choosing a permutation producing $a^*(x)$ from $a(x)$ which guarantees both the divisibility of $a^*(x)$ by $g(x)$ and good error correction performance for the turbocode thus specified is, on the other hand, more difficult.

This problem can bring about disparities between the error probabilities after decoding of the different bits constituting $u(x)$.

In an article which appeared in Volume 31, No. 1 of the journal "Electronics Letters" on Jan. 5, 1995, Messrs. BAR-BULESCU and PIETROBON explain that an interleaver can be described by successively and cyclically arranging the terms of the sequence $\underline{a}$ in a number of sequences equal to the degree of the polynomial $g(x)$ incremented by one, and that, in this case, permutations internal to each of the sequences thus formed bring about an equality between the remainder of the division defining the sequence $\underline{b}$ and that of the division defining the sequence $\underline{c}$.

However, and contrary to what is said in this article, this assertion is true only if the polynomial $g(x)$ is of the form $\Sigma_{i=0 \text{ to } m} x^i$.

In an article entitled "Turbo-block-codes" and published with the reports of the "turbocoding" seminar organised by the Institute of Technology in Lund (Sweden) (Department of Applied Electronics) in August 1996, Messrs. C. BERROU, S. EVANO and G. BATTAIL explain that, by arranging the terms of the sequence $\underline{u}$, cyclically, in a number of columns equal to a multiple of the degree N0 of the polynomial of type $x^n-1$ of smallest strictly positive degree which is divisible by $g(x)$, permutations internal to each of the columns thus formed bring about the situation that the sum of the remainder of the division defining the sequence $\underline{b}$ and that of the division defining the sequence $\underline{c}$ is null, with the result that the concatenation of the sequences is divisible by $\underline{g}$.

This document, just like the previous one, therefore restricts the choice of interleavers to particular forms working independently on subsets of the terms of the sequence $\underline{a}$, applying internal permutations to them. It does not however guarantee that individually $a(x)$ and $a^*(x)$ are divisible by $g(x)$. The only thing guaranteed is the divisibility by $g(x)$ of the polynomial representing the concatenation $(\underline{a}, \underline{a}^*)$, consisting of putting the two sequences $\underline{a}$ and $\underline{a}^*$ end to end.

The consequence is a possible loss of efficiency of the decoder since the latter is not informed about the state the coder had at the instant marking the end of the calculation of $\underline{b}$ and the start of the calculation of $\underline{c}$.

None of the articles cited propose an effective choice of interleaver.

With a view to overcoming these drawbacks, in a first instance, the inventors perfected a solution guaranteeing the return to zero not only of the sequence to be coded but also of each of the redundant sequences. This solution is explained in the following paragraphs:

A turbocoder of 1/3 efficiency can be considered as a pair of convolutional systematic coders (see FIG. 1) with divisor polynomials such that the first coder produces a check sequence from the sequence of symbols to be coded $\underline{u}$ and the second coder produces a check sequence from an interleaved sequence $\underline{u}^*$ obtained by interleaving the sequence $\underline{u}$. In this context, the simultaneous return to zero of the two coders is a classic problem. One way of solving it has been found by the inventors and is summarized below.

Let $g(x)$ be the divisor polynomial of a turbocoder. Let m be the degree of the polynomial $g(x)$ and N0 the smallest integer such that $g(x)$ is a divisor of the polynomial $x^{N0}+1$. This number N0 will be referred to as the "period" of $g(x)$. For reasons described below, $g(x)$ is considered to be a "polynomial without square" and this means that N0 is an odd number.

Let also n be an odd multiple of N0: n=M N0.

A sequence of symbols, $\underline{u}$, then has a polynomial representation, $u(x)$, of degree n−m−1, with binary coefficients, and this polynomial $u(x)$ is pre-encoded into:

$$a(x)=u(x)+\Sigma_{i=n-m \text{ to } n-1} a_i x^i$$

where the m binary symbols $a_i$ are chosen in such a way that $a(x)$ is a multiple of $g(x)$. In consequence of this precoding, and the chosen values of the parameters, if $a(x)$ is a multiple of $g(x)$, then $a^*(x)=a(x^e)$ modulo $x^n+1$ is also a multiple of $g(x)$ for any value of e which is a power of 2.

In the remainder of the description, this type of permutation and interleaver is referred to as an "x to $x^e$ type".

Here, it is necessary to consider that $g(x)$ has no multiple factors since, in general, $a^*(x)$ has the guarantee of being divisible only by the irreducible factors of $g(x)$.

The coded version of $\underline{u}$ is then given by $\underline{v}=[a, ah_1/g, a^*h_2/g]$ where all the components are polynomials, and where, in particular, $a^*h_2/g$ is also a polynomial, by virtue of the definition of $a^*$ and the choice of e as a power of 2.

More generally, the inventors discovered that the interleavers guaranteeing the return to zero, not only of the check sequence coming from the first coder but also of that originating from the second coder, had to meet the following condition:

each "permuted" sequence, $a_{ij}^*$, (i=1, ... ,K; j=1, ... , M1), is obtained by a permutation of the corresponding sequence $a_i$, the said permutation being, in a representation where the binary data items of each sequence $a_i$ are written, row by row, into a table with N0 columns and M rows, N0 being the smallest integer such that each divisor polynomial $g_i(x)$ divides $x^{N0}+1$, the result of any number of so-called elementary permutations, each of which:

either has the property of transforming the cyclic code of length N0 and with generator polynomial $g_i(x)$ into an equivalent cyclic code with generator polynomial $g_{ij}(x)$ which may be equal to $g_i(x)$, and acts by permutation on the N0 columns of the table representing $a_i$, or is any permutation of the symbols of a column of the said table.

This method applies to blocks of a given length allowing each of the elementary coders to be suitably reset to zero. However, the input sequence must have a certain length depending solely on the divisor polynomial or polynomials used. This must be a multiple of a number N0.

It should be noted here that, in this particular embodiment of the teaching mentioned above with an "x to $x^e$" type interleaver, the length of the sequences to be coded must be odd whereas, in the general case, it can be even.

When the sequence of symbols to be coded does not correspond to this number (that is to say when the sequence of symbols to be coded, to which have been added so-called "padding" symbols which guarantee the divisibility of the polynomial representation of the resulting sequence, by a predetermined polynomial, has a length which is not a multiple of N0 and, in the preferential embodiment, an odd multiple of N0), the initial teaching of the inventors cannot be used directly. The same applies when the length of the sequences varies from one sequence to another.

Furthermore, the transmission conditions, the desired efficiency, the type of data, the type of transmission channel, or the signal/noise ratio of the channel are not taken into account, in the first instance of the invention produced by the inventors, this first instance not forming part of the art prior to the present invention, but, on the contrary, providing essential characteristics.

Moreover, in a turbocoder, the dimensioning of the memory cannot easily be adapted to transmission modes taking into account different block lengths.

If the pseudo-random interleavers of the prior art are considered, it is necessary to store all the interleavers capable of being used and the memory size required can be large.

The present invention intends to remedy these drawbacks.

To that end, the present invention, according to a first aspect, relates to a coding method, characterised in that:

1/ it takes into account at least one selection criterion related to a transmission of binary symbols representing a physical quantity, 2/ it has an operation of selecting transmission parameters, according to at least one selection criterion, each said selected transmission parameter being in the set of parameters comprising:

a number K, greater than or equal to 1, of sequences $a_i$ (i=1, ... , K) of binary symbols, to be coded, an integer M1, equal to or greater than 2,
a divisor polynomial $g_i(x)$,
an integer M,
an interleaver, and
a multiplier polynomial $f_{ij}(x)$, 3/ it has an operation of inputting the number K of sequences $a_i$ (j=1, ... , K) of binary data, each sequence $a_i$ having:

a polynomial representation $a_i(x)$ which is a multiple of a polynomial $g_i(x)$, and a number of binary data items equal to the product of the integer number M and the integer N0, the smallest integer such that the polynomial $x^{N0}+1$ is divisible by each divisor polynomial $g_i(x)$;

4/ it has a first production operation for a number K*M1 of so-called "permuted" sequences", $a_{ij}^*$, (i=1, ... , K;j=1, ... ,M1), each sequence $a_{ij}^*$ being obtained by a permutation of the corresponding sequence $a_i$, the said permutation being, in a representation where the binary data items of each sequence $a_i$ are written, row by row, into a table with N0 columns and M rows, the result of any number of so-called elementary permutations, each of which:

either has the property of transforming the cyclic code of length N0 and with generator polynomial $g_i(x)$ into an equivalent cyclic code with generator polynomial $g_{ij}(x)$ which may be equal to $g_i(x)$, and acts by permutation on the N0 columns of the table representing $a_i$, or is any permutation of the symbols of a column of the said table; and having, in consequence, a polynomial representation $a_{ij}^*(x)$ which is equal to a polynomial product $c_{ij}(x)$ $g_{ij}(x)$, at least one permuted sequence $a_{ij}^*$ being different from the corresponding sequence $a_i$, 5/ it has a second production operation for M1 redundant sequences, the polynomial representation of which is equal to $\Sigma f_{ij}(x) c_{ij}(x)$, for j=1, ... ,M1, each polynomial $f_{ij}(x)$ being a polynomial of degree at most equal to the degree of the polynomial $g_{ij}(x)$ with the same indices i and j.

By virtue of these provisions, the parameters for implementation of the turbocoder can be adapted to the transmission of symbols, to their number or to the transmission conditions. Thus, a compromise between ease of coding and/or of decoding, speed of decoding, passband, in terms of number of symbols or of frames correctly transmitted per second, and transmission time of each symbol, can be optimized according to the selection criteria considered.

For a better understanding of the invention, a very particular example embodiment is given below: in an example where the selection criterion is the length of the sequence of symbols to be coded, for given coding polynomials, of which notably a polynomial g(x) of "period N0" and with no multiple roots is used in both elementary coders (it is assumed in order to simplify the explanation that the same feedback polynomial g(x), known to persons skilled in the art also by the name "divisor" polynomial, is used in the elementary coders before and after interleaving), the implementation of the method of the invention has the following steps:

1/ The length of the sequence is first analyzed and a value n, a multiple of N0 and greater than this length, is determined.

2/ In the transmission device, so-called "padding" bits are added to the input sequence so that the polynomial representation of the resulting sequence is divisible by the feedback or "divisor" polynomial g(x).

3/ Null stuffing bits are then added at the end of this sequence so that the resulting sequence has a length n.

4/ An interleaver is generated with parameters chosen as a function of n.

5/ The sequence is "turbocoded".

6/ The stuffing bits are removed from the sequence identical to the sequence to be coded.

7/ The sequence is encapsulated in a radio frame which is, itself, modulated and then transmitted on the transmission channel which connects the transmission device to the receiving device.

8/ The receiving device demodulates the received signal, extracts the encapsulated signal from the radio frame, analyzes the length n of this sequence and from it deduces the number of stuffing bits and the turbodecoder parameters.

9/ An interleaver and a de-interleaver are generated with parameters chosen as a function of n.

10/ The received sequence to which the stuffing bits have been added is decoded.

11/ The stuffing and padding bits are removed and an estimate of the input sequence is delivered to its destination.

The reader who wishes to know the stuffing method better can refer to the following article:

"*A new scheme to terminate all trellis of turbo decoder for variable block length*", the authors of which are Koora and Finger (Dresden Univ. Germany), International Symposium on Turbo codes, Brest, France, 1997.

The present invention therefore allows a dynamic adaptation of the turbocoder and of the decoder to each selection criterion, such as the length of the input sequence.

According to particular characteristics, during an addition operation, there are added, to the sequence $\underline{a}$ resulting from the padding bits addition operation, so-called "padding" additional data items, the number of which is equal to the degree of the divisor polynomial g(x) and which guarantee the divisibility of the polynomial representation of the sequence resulting from the addition operation by the divisor polynomial g(x).

Thus, the padding operation guarantees the return to zero of each of the coders. The consequence is an optimization of the turbocoder performance.

According to particular characteristics, an addition operation includes a stuffing operation during which are added, to the sequence $\underline{a}$ resulting from the padding bits addition operation, so-called "stuffing" additional data items, of predetermined value, which guarantee that the number n of symbols of the binary sequence resulting from the stuffing operation meets the conditions of being:

greater than or equal to (n'+m), a multiple of N0, the smallest integer such that $x^{N0}+1$ is divisible by g(x), and odd.

By virtue of these provisions, the method to which the present invention relates provides an adaptation to all the values of symbol sequence length since the number of elements of the interleaver must here be an odd multiple of N0 whereas the length of the sequence of symbols to be coded might not be a multiple of N0, nor an odd number.

According to particular characteristics, at least one of the sequences resulting from the coding operation has not been subject to any interleaving and in that it has an operation of removing data items from at least one sequence resulting from the coding operation not having been subject to any interleaving.

Thus, the number of symbols to be transmitted on the transmission channel is reduced.

According to particular characteristics, during the first production operation for a number K*M1 of so-called "permuted" sequences, $a_{ij}^*$, (i=1, ... ,K; j=1, ... ,M1), each sequence $a_{ij}^*$ has a polynomial representation equal to $a_{ij}^*(x)=a_i^*(x^{e_{ij}})$, modulo $(x^n+1)$, where n is the product of the number M and the integer N0, $e_{ij}$ is a number relatively prime with n, the polynomial $g_{ij}(x)$ is the generator polynomial of the smallest cyclic code of length N0 containing the polynomial $g_i(x^{e_{ij}})$ modulo $(x^{N0}+1)$, The advantages of these provisions are those of the so-called "x to $x^e$" interleavers which are easily adapted to an "on the fly" generation, by the use of simple algorithms. Furthermore, since these algorithms are capable of being carried out by simple logic circuits or by a microprocessor, the implementation of the present invention is advantageously combined with this type of turbocoder.

The present invention allows, furthermore, a saving in the amount of memory used since the "x to $x^e$" type interleaver is fully defined, and simple to generate from values of e and n.

By virtue of these provisions, the present invention is simple to implement and has very good performance in terms of bit and frame error rates as a function of the signal/noise ratio.

According to particular characteristics, during the transmission parameter selection operation, a value of the exponent e is selected, as a function of at least one selection criterion. By virtue of these provisions, the particular parameters of the "x to $x^e$" type interleavers are adapted to the selection criteria mentioned above in order to optimize the turbocoder performance.

According to particular characteristics, the coding method to which the present invention relates, as briefly described above, has an interleaver generation operation, the said interleaver defining the permutations performed during the first production operation, and in that, during the said generation operation, the interleaver is constituted by the iterative implementation of an addition operation, modulo a predetermined number.

Thus, a simple addition, modulo n, allows the generation of the interleaver, which simplifies this generation and can considerably reduce its duration.

According to particular characteristics, the method to which the invention relates, as briefly described above 1/ takes into account:
 a value of K equal to 1,
 a "polynomial without square" $g_1(x)$,
 N0, the smallest integer such that $g_1(x)$ is a divisor of the polynomial $x^{N0}+1$;
 n, an odd multiple of N0;
 a sequence $\underline{u}$ of n symbols $u_i$ to be coded; and
 e, a power of 2, for which the residue of e modulo N0 is equal to 1, 2/ has:
 an operation of composing a so-called "concatenated" sequence $\underline{uu}^*$ composed successively, on the one hand, of the sequence of symbols $\underline{u}$, having n symbols, and, on the other hand, of a sequence of symbols $\underline{u}^*$ defined by its polynomial representation, $u^*(x)=u(x^e)$ modulo $x^n+1$, a coding operation including at least one division of the concatenated sequence uu* by the polynomial $g_1(x)$ in order to form a so-called "check" sequence.

By virtue of these provisions, the addition of padding bits is unnecessary. The efficiency is therefore better and the implementation of the invention is simplified.

According to a second aspect, the present invention relates to a decoding method, characterised in that:

1/ it takes into account at least one selection criterion related to a transmission of binary symbols representing a physical quantity, 2/ it has an operation of selecting transmission parameters, according to at least one selection criterion, each said selected transmission parameter being in the set of parameters comprising:
an integer M1, equal to 2,
a number K, greater than or equal to 1, of sequences $v_i(i=1, \ldots, K+M1)$ of symbols to be decoded,
a divisor polynomial $g_i(x)$,
an integer M,
an interleaver/de-interleaver pair, and
a multiplier polynomial $f_{ij}(x)$, 3/ it has an operation of inputting the number K+M1 of sequences $v'_i(i=1, \ldots, K+M1)$ of symbols to be decoded, 4/ it has an operation of decoding K sequences of symbols using the divisor polynomials $g_{ij}(x)$, the said decoding operation providing K so-called "decoded" sequences.

5/ it has a permutation operation, the said permutation being, in a representation where the binary data items of each sequence $v_i$ are written, row by row, into a table with N0 columns and M rows, the result of any number of so-called elementary permutations, each of which:
either has the property of transforming the cyclic code of length N0 and with generator polynomial $g_i(x)$ into an equivalent cyclic code with generator polynomial $g_{ij}(x)$ which may be equal to $g_i(x)$, and acts by permutation on the N0 columns of the table representing $a_i$,
or is any permutation of the symbols of a column of the said table,
at least one permuted sequence $a_{ij}*$ being different from the corresponding sequence $a_i$.

The invention also relates to:

an information storage means readable by a computer or a microprocessor storing instructions of a computer program, characterised in that it allows the implementation of the method of the invention as briefly described above, and an information storage means which is removable, partially or totally, and readable by a computer or a microprocessor storing instructions of a computer program, characterised in that it allows the implementation of the method of the invention as briefly described above.

The invention also relates to:

a device for processing signals representing speech, which has a device as briefly described above, a data transmission device having a transmitter adapted to implement a packet transmission protocol, which has a device as briefly described above, a data transmission device having a transmitter adapted to implement the ATM (Asynchronous Transfer Mode) packet transmission protocol, which has a device as briefly described above, a data transmission device having a transmitter adapted to implement the packet transmission protocol, on an ETHERNET (registered trade mark) type network, a network station, which has a device as briefly described above, a data transmission device having a transmitter transmitting on a wireless channel, which has a device as briefly described above, and a device for processing sequences of signals representing at most one thousand binary data items, which has a device as briefly described above.

The invention also relates to an information processing device comprising:

first coding means for inputting a first sequence represented by a multiple of a predetermined polynominal and producing a second sequence;

permuting means for producing a permuted sequence represented by said multiple of said predetermined polynominal by permuting said first sequence;

second coding means for inputting said permuted sequence and producing a third sequence; and controlling means for controlling said permuting means in accordance with a data length of said first sequence.

According to a particular characteristic, the data length of said first sequence varies in accordance with said predetermined polynominal.

According to a particular characteristic, said controlling means modifies the permutation operation performed by said permuting means in accordance with the data length of said first sequence.

According to a particular characteristic, said controlling means further modifies the permutation operation performed by said permuting means in accordance with the type of information included in said first sequence.

According to a particular characteristic, said controlling means further modifies the permutation operation performed by said permuting means in accordance with the condition of transmission.

According to a particular characteristic, said first sequence includes at least either one of audio information, character information or image information.

According to a particular characteristic, this information processing device performs turbocoding of said first sequence.

According to a particular characteristic, this information processing device is a data communication device.

According to a particular characteristic, this information processing device is a wireless communication device.

The invention also relates to an information processing method comprising:

first coding step of inputting a first sequence represented by a multiple of a predetermined polynominal and producing a second sequence;

permuting step of producing a permuted sequence represented by said multiple of said predetermined polynominal by permuting said first sequence;

second coding step of inputting said permuted sequence and producing a third sequence; and controlling step of controlling said permuting step in accordance with a data length of said first sequence.

The invention also relates to a storage medium readable by a computer, storing a program for performing:

first coding process for inputting a first sequence represented by a multiple of a predetermined polynominal and producing a second sequence;

permuting process for producing a permuted sequence represented by said multiple of said predetermined polynominal by permuting said first sequence;

second coding process for inputting said permuted sequence and producing a third sequence; and controlling process for controlling said permuting process in accordance with a data length of said first sequence.

The invention also relates to an information processing device comprising:

first decoding means for inputting a first sequence and a second sequence which is represented by a multiple of a predetermined polynominal;

first permuting means for permuting an output of said first decoding;

second decoding means for inputting the output of said second decoding means and a third sequence represented by said multiple of said predetermined polynominal;

second permuting means for permuting the output of said second decoding means and supplying the result of said permutation to said first decoding means; and controlling means for controlling said first permuting means and said second permuting means in accordance with a data length of said first sequence.

According to a particular characteristic, the data length of said first sequence varies in accordance with said predetermined polynominal.

According to a particular characteristic, said controlling means modifies the permutation operation performed by said first permuting means and the permutation operation performed by said second permuting means in accordance with the data length of said first sequence.

According to a particular characteristic, said controlling means further modifies the permutation operation performed by said first permuting means and the permutation operation performed by said second permuting means in accordance with the type of information included in said first sequence.

According to a particular characteristic, said controlling method further modifies the permutation operation performed by said first permuting means and the permutation operation performed by said second permuting means in accordance with the condition of transmission.

According to a particular characteristic, said first sequence includes at least either one of audio information, character information and image information.

According to a particular characteristic, this information processing device performs turbodecoding of said first sequence.

According to a particular characteristic, this information processing device is a data communication device.

According to a particular characteristic, this information processing device is a wireless communication device.

The invention also relates to an image processing method comprising:

first decoding step of inputting a first sequence and a second sequence which is represented by a multiple of a predetermined polynominal;

first permuting step of permuting an output of said first decoding step;

second decoding step of inputting an output of said first permuting step and a third sequence represented by said multiple of said predetermined polynominal;

second permuting step of permuting an output of said second decoding step and supplying the result of said permutation to said first decoding means; and controlling step of controlling said first permuting step and said second permuting step in accordance with a data length of said first sequence.

The invention also relates to a storage medium readable by a computer, storing a program for performing:

first decoding process for inputting a first sequence and a second sequence which is represented by a multiple of a predetermined polynominal;

first permuting process for permuting an output of said first decoding process;

second decoding process for inputting an output of said permuting process and a third sequence represented by said multiple of said predetermined polynominal;

second permuting process for permuting and output of said second decoding process and supplying the result of said permutation to said first decoding process; and controlling process for controlling said first permuting process and said second permuting process in accordance with a data length of said first sequence.

These coding and decoding devices, these coding and decoding methods and these signal processing, data transmission and sequence processing devices, this network, these information processing devices and methods, these storage media and this image processing method having the same particular characteristics and the same advantages as the coding method as briefly described above, these particular characteristics and these advantages are not repeated here.

Figure 2:
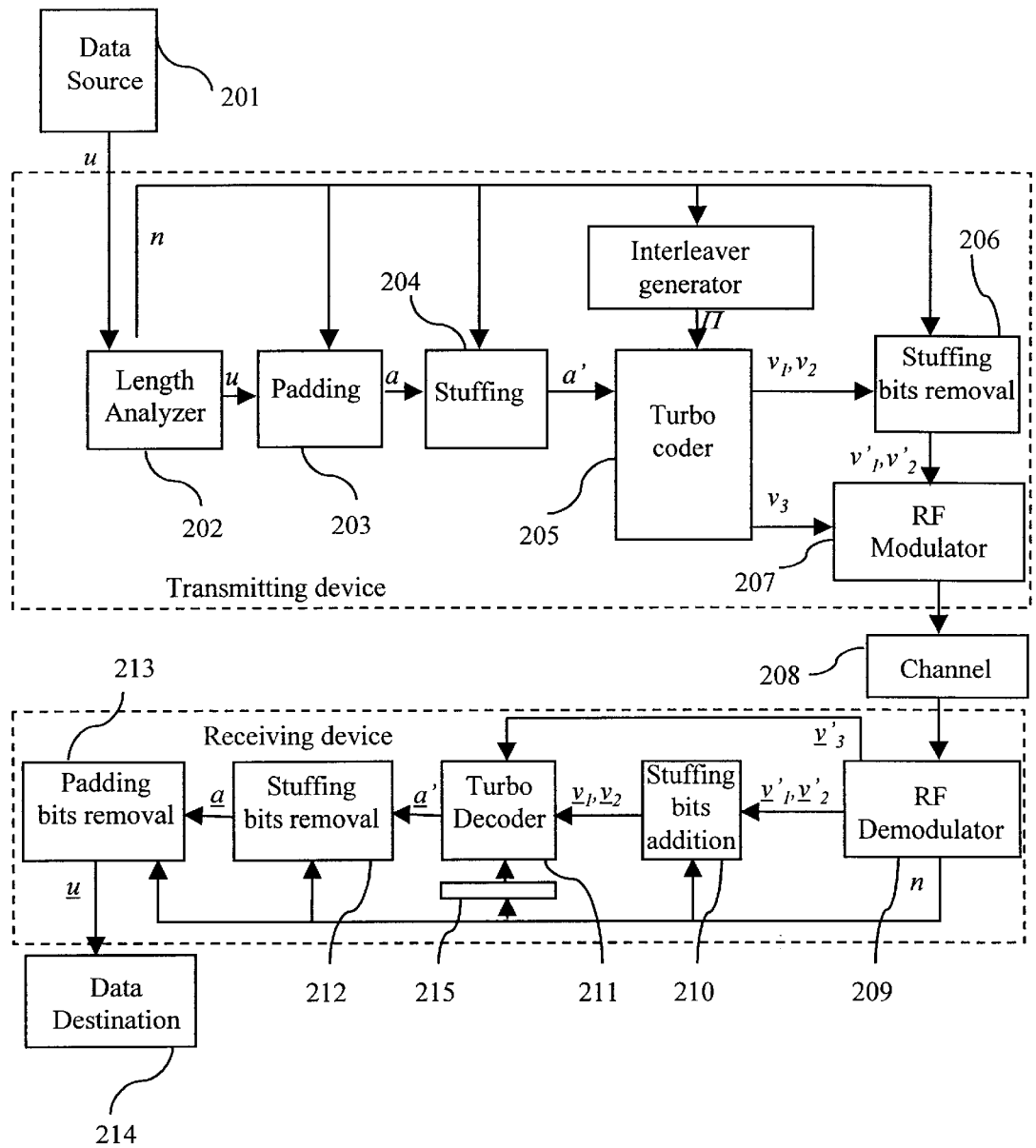
Figure 3:
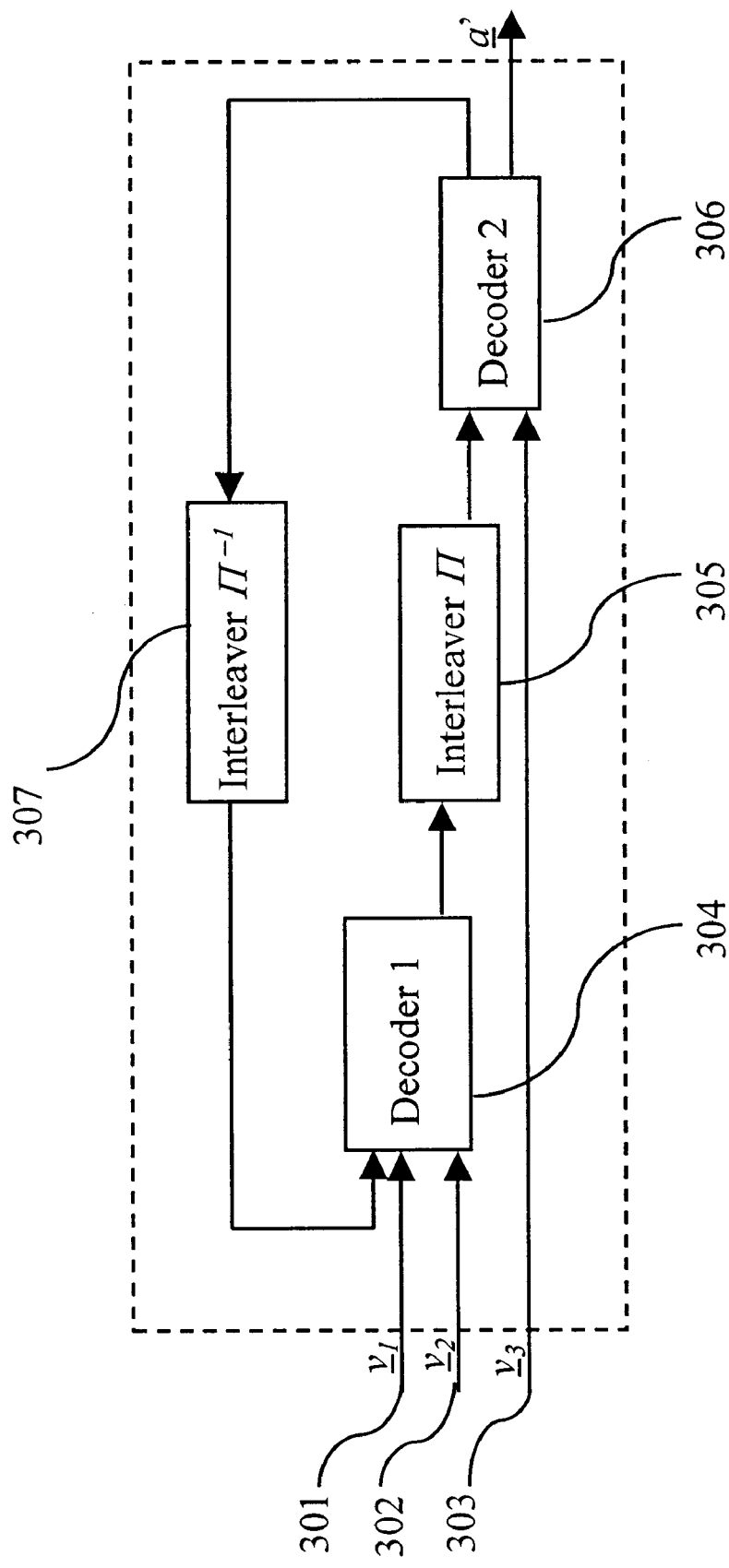
Figure 4:
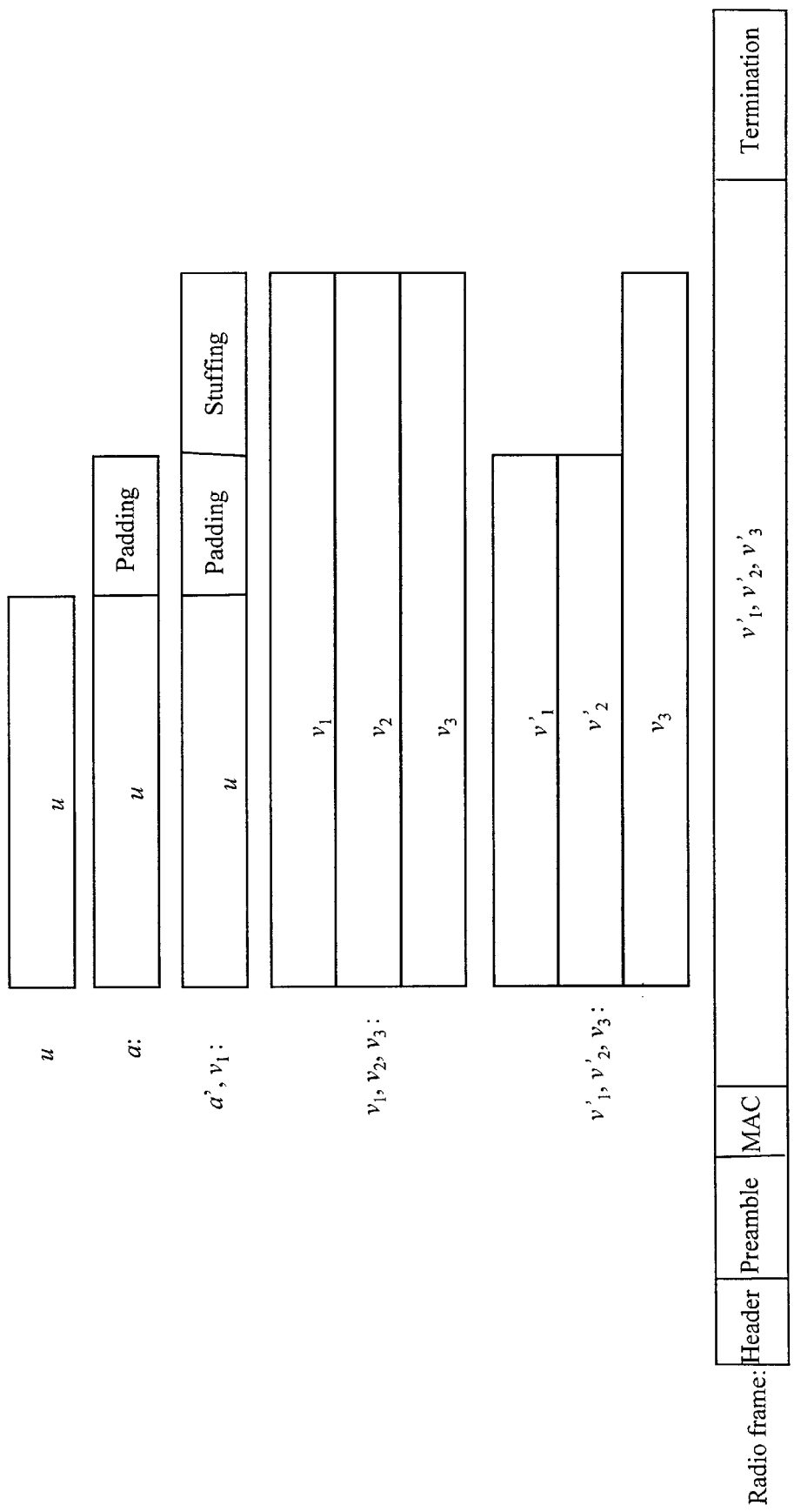
Figure 9:
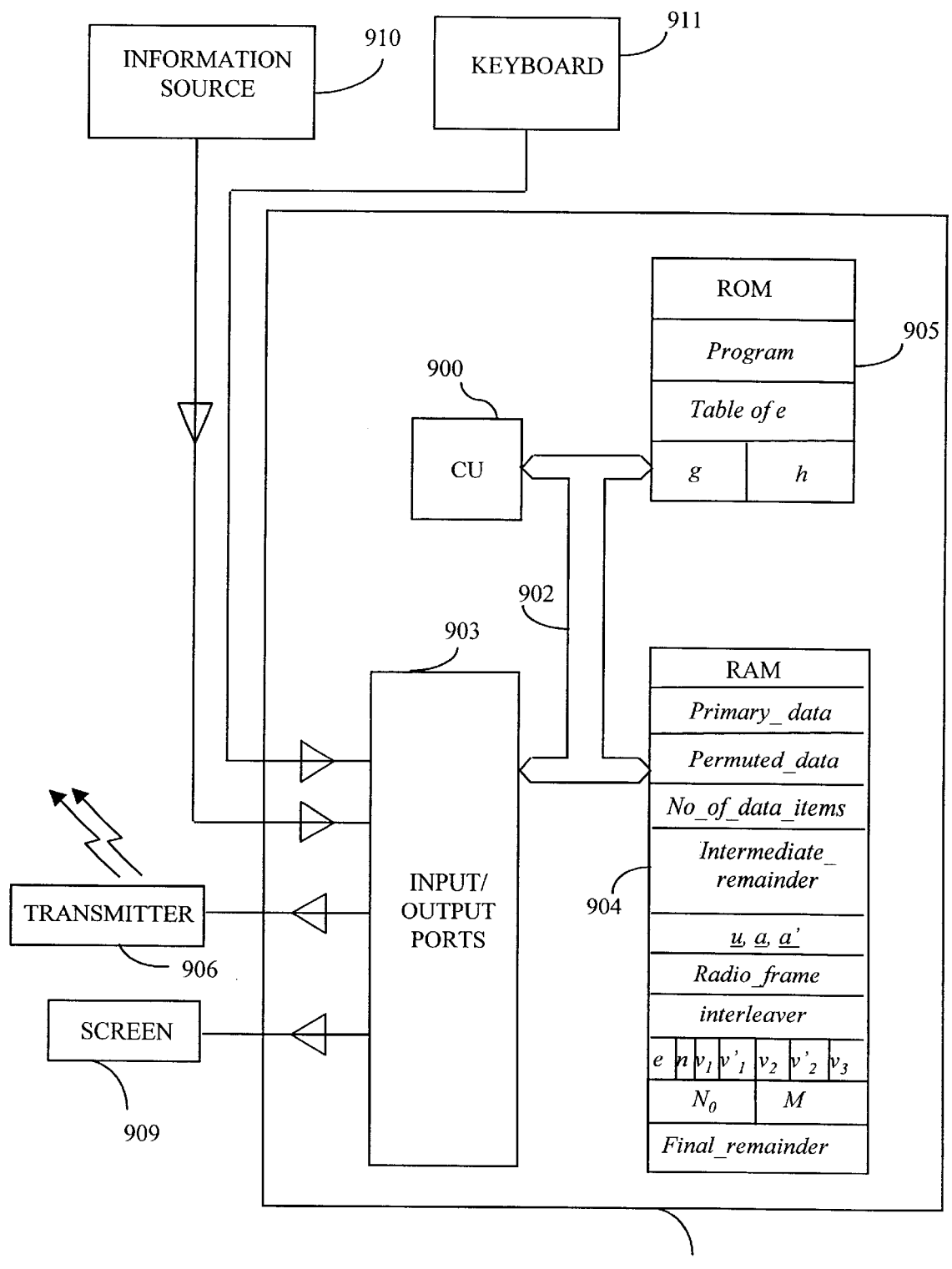
Figure 10:
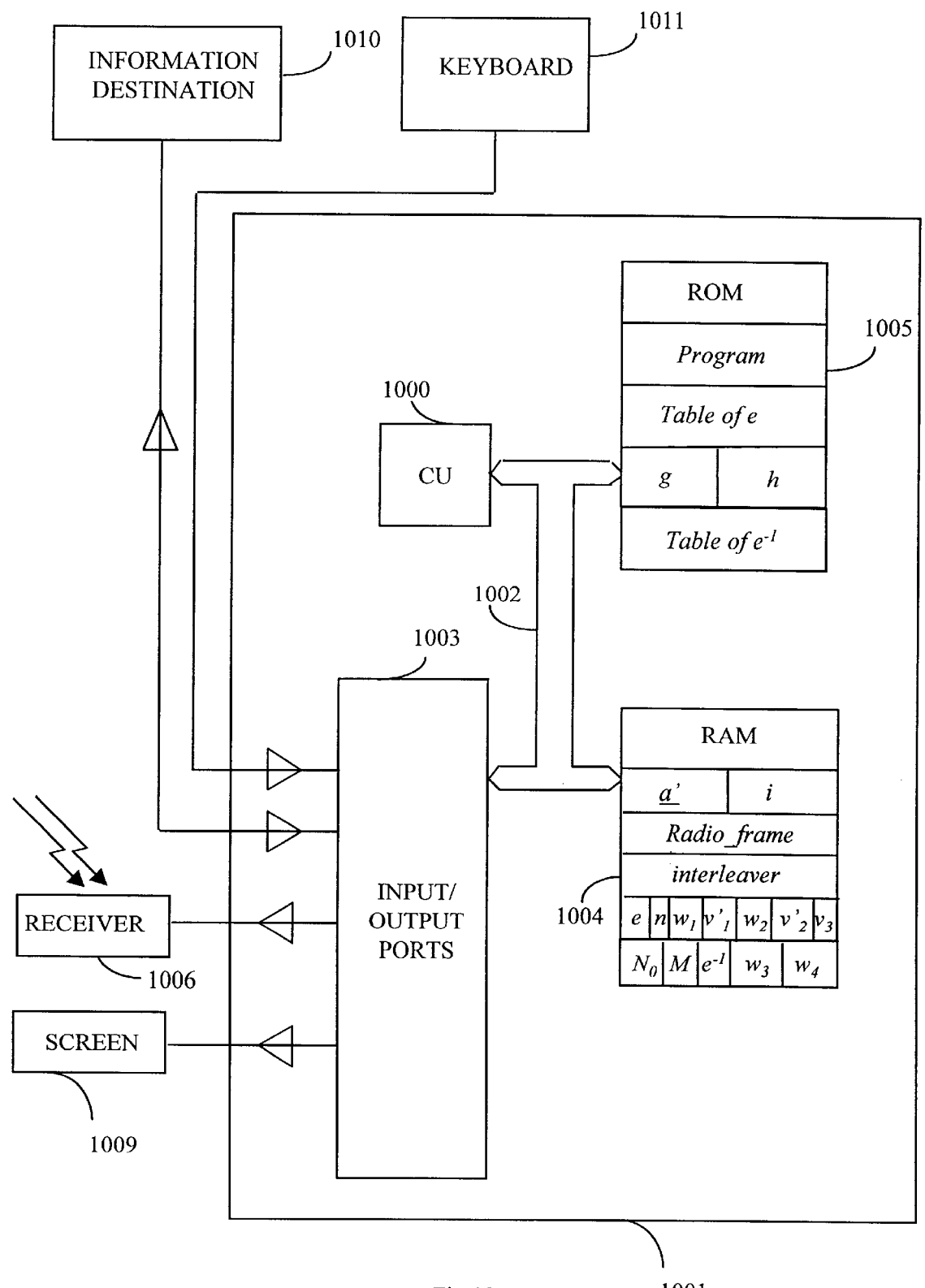
Figure 11:
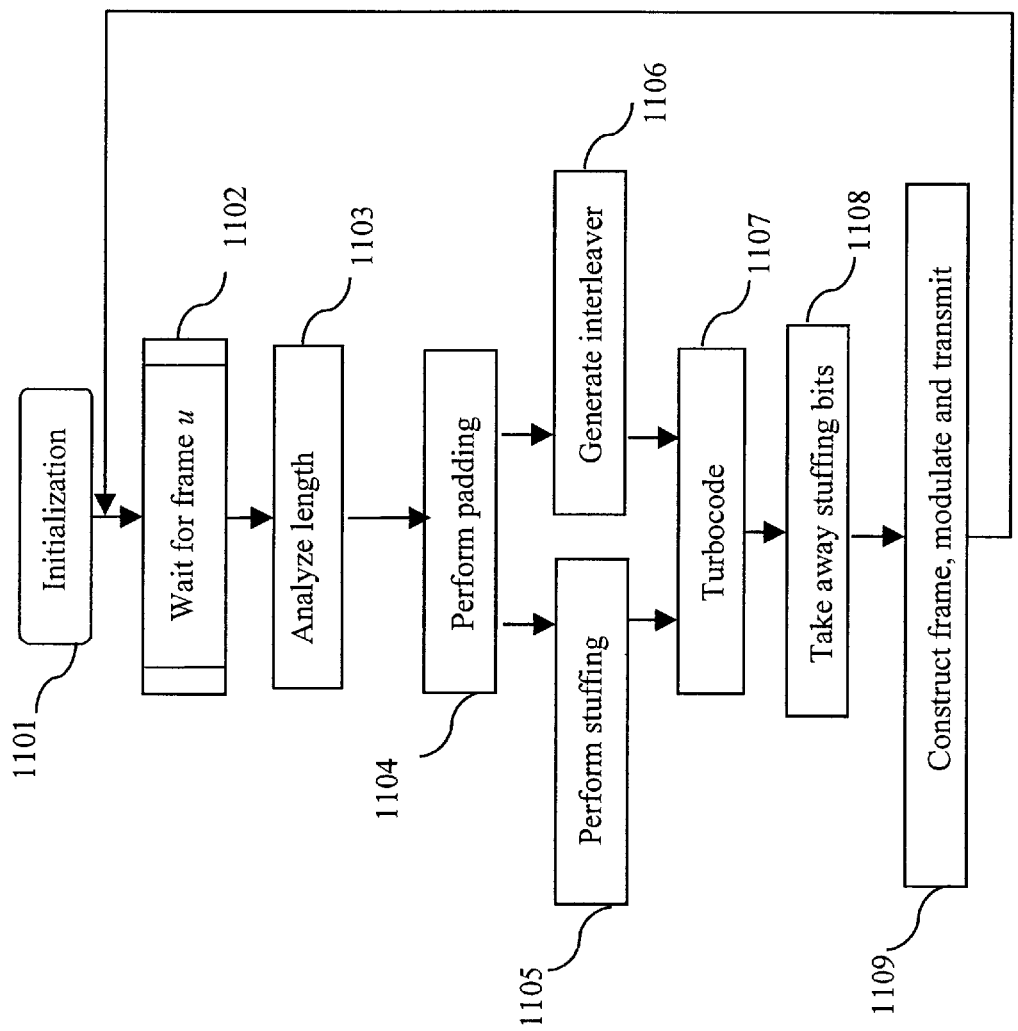
Figure 12:
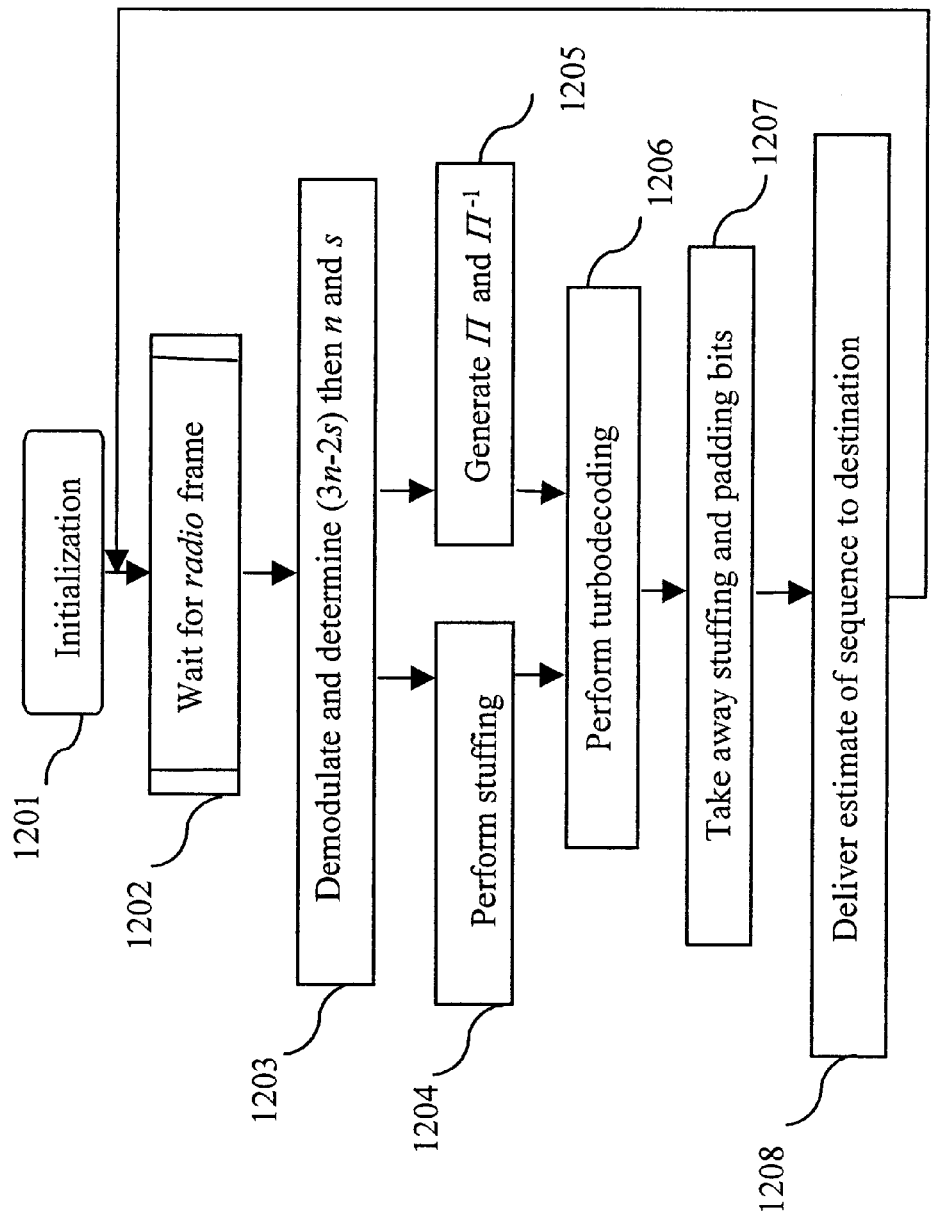
Figure 13:
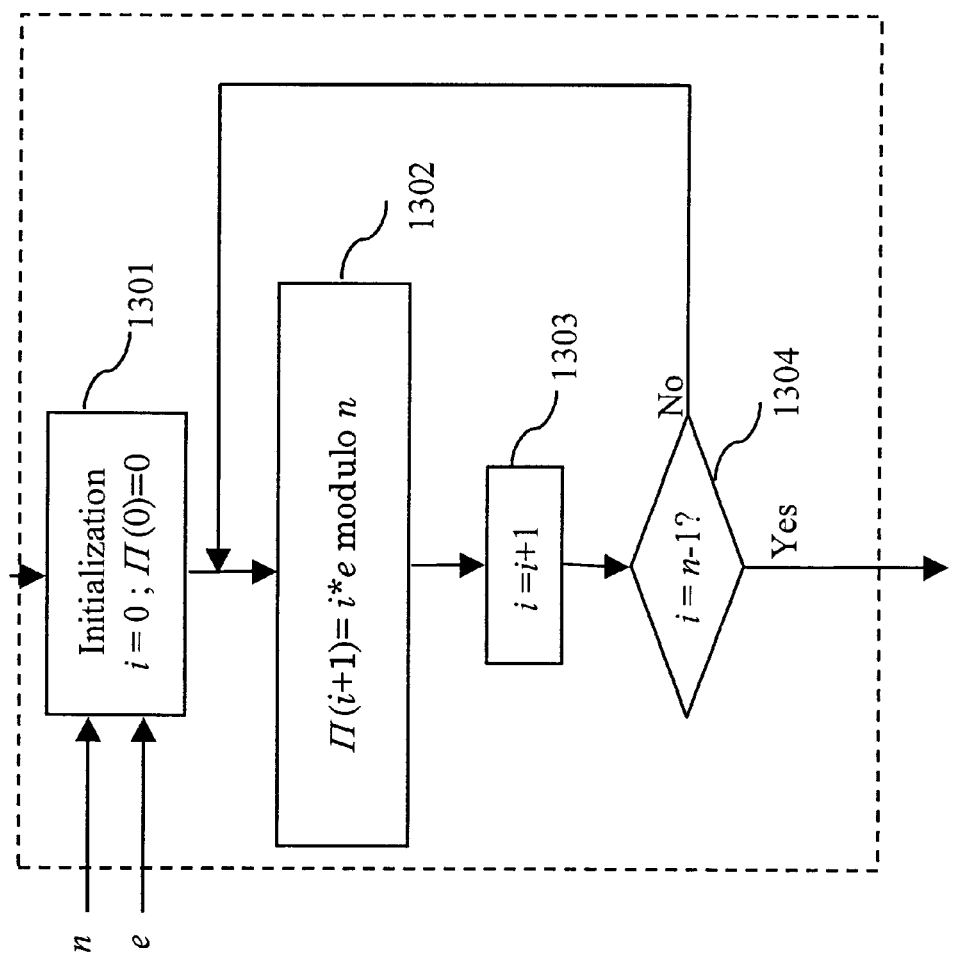
Figure 14:
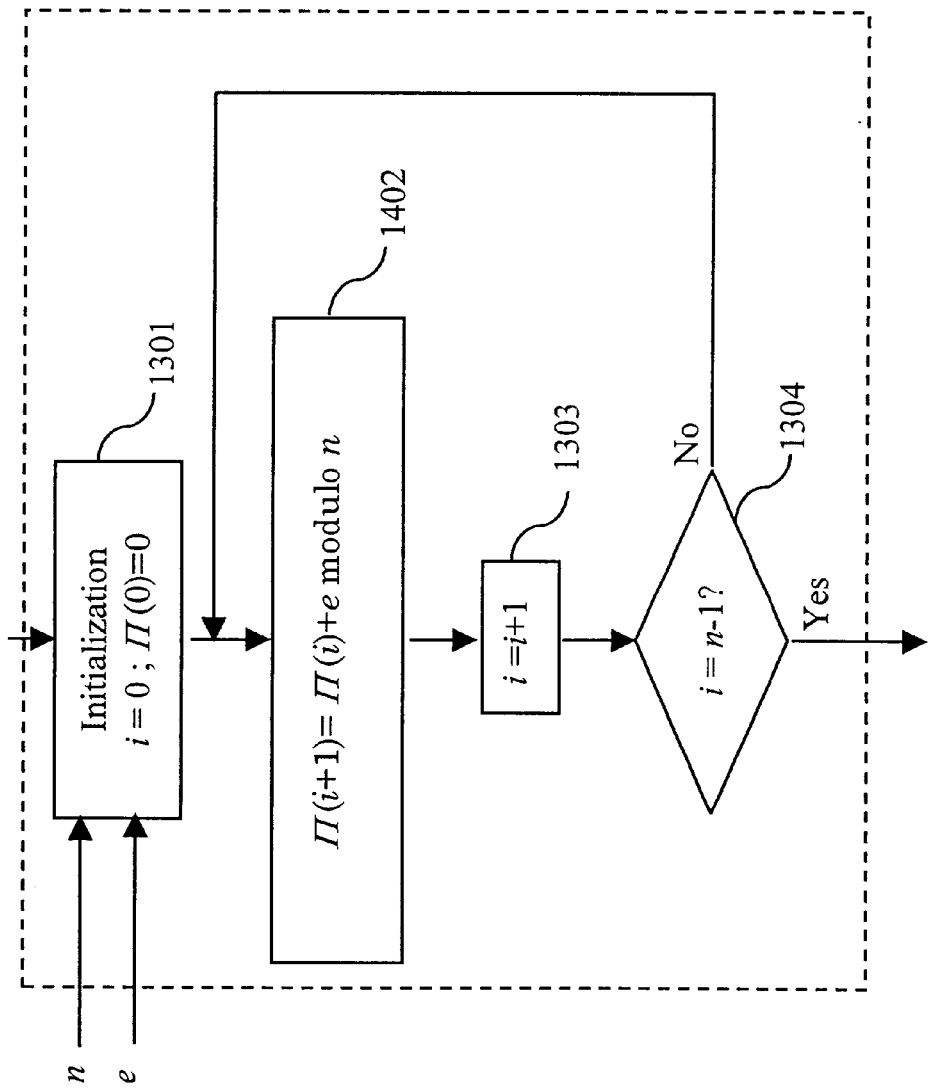

Other advantages, aims and characteristics of the present invention will emerge from the description which follows, produced with reference to the accompanying drawings, in which:

FIG. 1 depicts, in block diagram form, a turbocoding device in accordance with the prior art, FIG. 2 depicts, in functional block diagram form, a turbocoding device and a turbodecoding device of a first embodiment of the present invention, in which turbocoding and turbodecoding parameters are functions of a number of symbols to be transmitted, FIG. 3 depicts, in block diagram form, a turbodecoding device according to the first embodiment of the present invention, FIG. 4 depicts sequence and frame formats used in the first embodiment of the present invention, FIGS. 5 to 8 depict memory registers of a turbocoding device and of a turbodecoding device, in the prior art and in the first embodiment of the present invention, FIG. 9 depicts, schematically, the components of a coding device adapted to implement the first embodiment of the present invention, FIG. 10 depicts, schematically, the components of a decoding device adapted to implement the first embodiment of the present invention, FIG. 11 depicts a flow diagram of the operation of the coding device illustrated in FIG. 9, FIG. 12 depicts a flow diagram of the operation of the decoding device illustrated in FIG. 10, and FIGS. 13 and 14 depict flow diagrams of interleaver generation according to two variants capable of being implemented during the operation illustrated in FIGS. 11 and 12.

It should be noted, in FIG. 1, that a parallel turbocoding device, in accordance with the art prior to the present invention has essentially:

an input of symbols to be coded, 101, where a source, not depicted, provides a sequence of binary symbols to be transmitted, or "to be coded", $\underline{a}$, a first coder 102, which provides, from the sequence $\underline{a}$, two sequences $\underline{v}_1$ and $\underline{v}_2$ of symbols representing the sequence $\underline{a}$, an interleaver 103, which provides, from the sequence $\underline{a}$, an interleaved sequence $\underline{a}^*$, the symbols of which are the symbols of the sequence $\underline{a}$, but in a different order, and a second coder 104, which provides, from the interleaved sequence $\underline{a}^*$, a third sequence, $\underline{v}_3$, representing the sequence $\underline{a}$.

The three sequences $\underline{v}_1$, $\underline{v}_2$ and $\underline{v}_3$ are transmitted in order to be next decoded.

The remainder of the description is concerned only with "x to $x^e$" type interleavers, although it should be noted that the present invention is not limited to this type of interleaver but concerns, more generally, all interleavers which, 1/ from sequences $a_i$ having:
  a polynomial representation $a_i(x)$ which is a multiple of a polynomial $g_i(x)$, and
  a number of binary data items equal to the product of the integer number M and the integer N0, the smallest integer such that the polynomial $x^{N0}+1$ is divisible by each divisor polynomial $g_i(x)$;

2/ produce so-called "permuted" sequences, $a_{ij}^*$, (i=1, . . . , K; j=1, . . . ,M1), each sequence $a_{ij}^*$
  being obtained by a permutation of the corresponding sequence $a_i$, the said permutation being, in a representation where the binary data items of each sequence $a_i$ are written, row by row, into a table with N0 columns and M rows, the result of any number of so-called elementary permutations, each of which:
    either has the property of transforming the cyclic code of length N0 and with generator polynomial $g_i(x)$ into an equivalent cyclic code with generator polynomial $g_{ij}(x)$ which may be equal to $g_i(x)$, and acts by permutation on the N0 columns of the table representing $a_i$,
    or is any permutation of the symbols of a column of the said table; and
  having, in consequence, a polynomial representation $a_{ij}^*(x)$ which is equal to a polynomial product $c_{ij}(x) g_{ij}(x)$,
  at least one permuted sequence $a_{ij}^*$ being different from the corresponding sequence $a_i$, 3/ so that elementary coders produce redundant sequences, the polynomial representation of which is equal to $\Sigma f_{ij}(x) c_{ij}(x)$, for j=1, . . . ,M1, each polynomial $f_{ij}(x)$ being a polynomial of degree at most equal to the degree of the polynomial $g_{ij}(x)$ with the same indices i and j.

Similarly, the description which follows has been limited to the case where a single sequence is coded, although the present invention applies equally well to the cases where a number of sequences of symbols are jointly and simultaneously coded.

The present description has been limited to parallel turbocodes, but it applies, with adaptations within the capability of persons skilled in the art, to serial turbocodes and to hybrid turbocodes (having a serial turbocoding part and a parallel turbocoding part).

The first coder, 101, used here is a systematic coder, that is to say the sequence $\underline{v}_1$ is identical to the sequence $\underline{a}$.

Finally, a polynomial $g(x)$ of "period N0" and of degree m is used as the divisor polynomial in both elementary coders.

In FIG. 2, it should be noted that, for the implementation of the present invention, a symbol source 201 provides a sequence of binary symbols $\underline{u}$. Such an "information source" produces sequences of symbols to be coded, n' representing the length of a sequence of symbols to be coded under consideration.

This sequence is analyzed by a length analyzer 202, which determines the number n' of binary symbols constituting the sequence $\underline{u}$ and determines all the operating parameters of the turbocoder:

a number K, greater than or equal to 1, of sequences $u_i$(i=1, . . . , K) of binary symbols, to be coded, an integer M1, equal to or greater than 1, a divisor polynomial $g_i(x)$, an integer M, an interleaver, a multiplier polynomial $f_{ij}(x)$, and a sequence length, n.

As regards determination of the number n, knowing the degree m–1 of the polynomial $g(x)$, this number n meets the conditions of being:

greater than or equal to (n'+m), a multiple of N0, the smallest integer such that $x^{N0}+1$ is divisible by $g(x)$, and odd.

Preferentially, n is the smallest number verifying these conditions.

The operation of selecting the interleaver parameters is explained by an example: if, as is assumed in the embodiment described and depicted, an "x to $x^e$" type interleaver is used, n being determined, it is sufficient to select the value of e.

For this, there will have been constructed beforehand a table giving, for each possible value of n, the best value of e. It will then only be necessary to read from this table, placed in non-volatile memory, the correct value of e.

As a variant, the same value of e, for example 32, is chosen for all possible values of n.

According to a variant, not depicted, during the operation 202, it is not the length n' of the sequence $\underline{u}$ to be coded which serves as the sole selection criterion for the transmission parameters, but one or more criteria, taken from among the following:

the length of the sequence $\underline{u}$ of symbols $\underline{u}_1$ to be coded, a coded sequence transmission channel, the signal/noise ratio of the coded sequence transmission channel, the type of data represented by the symbols to be coded (audio data, video data, computer file data, etc), a guaranteed quality of service for the transmission of the symbols to be coded, and a coding efficiency, are used to optimize a compromise between ease of coding and/or of decoding, speed of decoding, passband, in terms of number of symbols or of frames correctly transmitted per second, transmission time for each symbol, according to the selection criteria considered.

For the implementation of this variant, the criteria used at coding must be used at decoding. To that end, either, by construction, these criteria are fixed, both in the coding device and in the decoding device, or, their value can be determined directly at decoding by analysis of the radio frame (see operation 209, below), or the transmission of an appropriate information item informs the receiving device of certain criteria used. For example, the radio frame header can contain this information.

The interleaver being constructed algebraically, this interleaver can be defined by a calculation performed by a circuit in a simple manner: there is no need to store the table of interleaving corresponding to each possible length (see FIGS. 5 to 8). The interleaver being defined, the turbocoder performs the coding operation in a conventional manner:

- a "padding" operation, 203, is an operation which consists of adding m bits so that the polynomial associated with the sequence produced, $\underline{a}$, is divisible by the polynomial $g(x)$;
- a "stuffing" operation, 204, is an operation which adds s null bits to the sequence originating from the padding operation, so that the sequence produced, $\underline{a}'$, has the length n; s is therefore given by the equation $s=(n-n'-m)$; and
- a turbocoding operation, 205, of known type and determined by the divisor polynomial and the multiplier polynomials, first and second coders, on the one hand, and by the interleaver 103, on the other hand (in the embodiment illustrated in the Figures, the multiplier polynomials are equal).

After the turbocoding, the following are performed:

a removal operation, 206, during which:
- the s null bits added during the stuffing operation 204 are taken away from the sequence $\underline{v}_1$, which, it should be noted, is identical to the sequence $\underline{a}'$, since the first coder, 101, is systematic; the sequence resulting from the removal operation being referred to as $\underline{v}'_1$, and having the length n–s;
- the s parity bits corresponding, in the sequence $\underline{v}_2$, to the null bits added, in the sequence $\underline{v}_1$, during the stuffing operation 204, are taken away from the sequence $\underline{v}_2$ in order to produce a sequence referred to as $\underline{v}'_2$ which thus has the length n–s;

an operation of modulation 207, of known type, on a transmission channel 208, with encapsulation of the sequence in a radio frame, modulation and transmission of this frame on a transmission channel;

an operation of demodulation 209, of signals received on the channel 208 during which the demodulator uses the structure and/or the information belonging to the radio frame for determining the total length of the encapsulated sequence according to methods well known to persons skilled in the art of radio protocols. The length of this sequence being equal to (3n–2s), and s being preferentially between 0 and (2N0–1) inclusive, 3n is the smallest integer greater than or equal to (3n–2s) which is a multiple of 3N0 and odd. This number can be easily determined and n et s are easily deduced from it.

During the operation 209, the receiving device demodulates the received signal, extracts the encapsulated sequence from the radio frame, analyzes the length n of this sequence and from it deduces the number of stuffing bits and the turbodecoder parameters. In the remainder of the description, each estimated sequence and the sequence of which it is the estimate are noted in the same way in the receiving and decoding device.

According to a variant, not depicted, during the operation 209, the decoding device retrieves, for example from the radio frame header, an information item representing at least some of the criteria used by the coding device.

In the receiving device, a means performing the "stuffing" operation 210 restores the s stuffing bits in the estimated sequence $\underline{v}'_1$, and the corresponding s parity bits in the sequence $\underline{v}'_2$, the number s being a function of the sequence length n determined during the operation 209. The decoding being performed from "soft inputs" related to the reliability of each received symbol. The stuffing bits and the corresponding parity bits are assigned the highest possible reliability value corresponding to a null "hard bit".

During a decoding operation 215, an interleaver and its inverse interleaver (referred to as a "de-interleaver") are constructed as a function of the sequence length in a manner similar to what is carried out in the coder. It may be noted that, if an "x to $x^e$" interleaver is defined with $e=2^i$ modulo n, the inverse interleaver is of the same type, "x to $x^{e'}$" with $e'=2^{-i}$ modulo n.

In the remainder of the description, $e^{-1}$ is this value of e'.

The turbodecoder 211 decodes the frame with the interleaver and the de-interleaver (see FIG. 3). The s stuffing bits and m padding bits are then taken away (respectively during the stuffing bit removal operation 212 and padding bit removal operation 213) and the sequence is then transmitted to the data destination 214.

A numerical example will now be given, in which n'=139, $g(x)=1+x+x^3$. From this, m=3, N0=7, n=147 and s=5 are then deduced. For n=147, the value of e is chosen as equal to 25.

In FIG. 3, it should be noted that a decoding device is essentially composed of:

- three inputs 301, 302 and 303 of sequences $\underline{v}_1$, $\underline{v}_2$ and $\underline{v}_3$,
- a first decoder 304 corresponding to the coder 102 (FIG. 1) and receiving the sequences $\underline{v}_1$ and $\underline{v}_2$ as well as an extrinsic information sequence $\underline{w}_4$ described later, provides an a posteriori estimation sequence $\underline{w}_1$,
- an interleaver 305, identical to the interleaver 103 used in the coder, which receives the sequence $\underline{w}_1$ and interleaves it into $\underline{w}_2$,
- a second decoder 306, corresponding to the coder 104 and receiving the sequences $\underline{w}_2$ and $\underline{v}_3$, and provides on the one hand an a posteriori estimation sequence $\underline{w}_3$ and, on the other hand, an estimated sequence $\underline{a}'$, and
- a de-interleaver 307, the inverse of the interleaver 305, receiving the sequence $w_3$ and providing the sequence $\underline{w}_4$.

The estimated sequence $\underline{a}'$ is taken into account only following a predetermined number of iterations (see the article "*Near Shannon limit error-correcting coding and decoding: turbocodes*" cited above).

In accordance with the present invention, the decoders 304 and 306 are initialized taking into account the fact that the coders 102 and 104 each have a null initial state and final state.

In FIG. 4 should be noted successively, on rows ordered from top to bottom,

- the sequence $\underline{u}$ of symbols to be coded, of length n',
- the sequence $\underline{a}$ composed of the sequence $\underline{u}$ and of so-called "padding" bits which guarantee the divisibility of the polynomial representation of the sequence $\underline{a}$ by the divisor polynomial $g(x)$,
- the sequence $\underline{a}'$, identical to the sequence $\underline{v}_1$, composed of the sequence $\underline{a}$ and of so-called "stuffing" bits which give the sequence $\underline{a}'$ an odd length which is a multiple of N0,
- the sequences $\underline{v}_1$, $\underline{v}_2$ and $\underline{v}_3$, the last two of which result from the coding of the first,
- the sequences $\underline{v}'_1$, $\underline{v}'_2$ and $\underline{v}_3$, ($\underline{v}'_1$ being identical to the sequence $\underline{a}$), and
- the radio frame which contains, as the payload, the sequences $\underline{v}'_1$, $\underline{v}'_2$ and $\underline{v}_3$.

Figure 5:
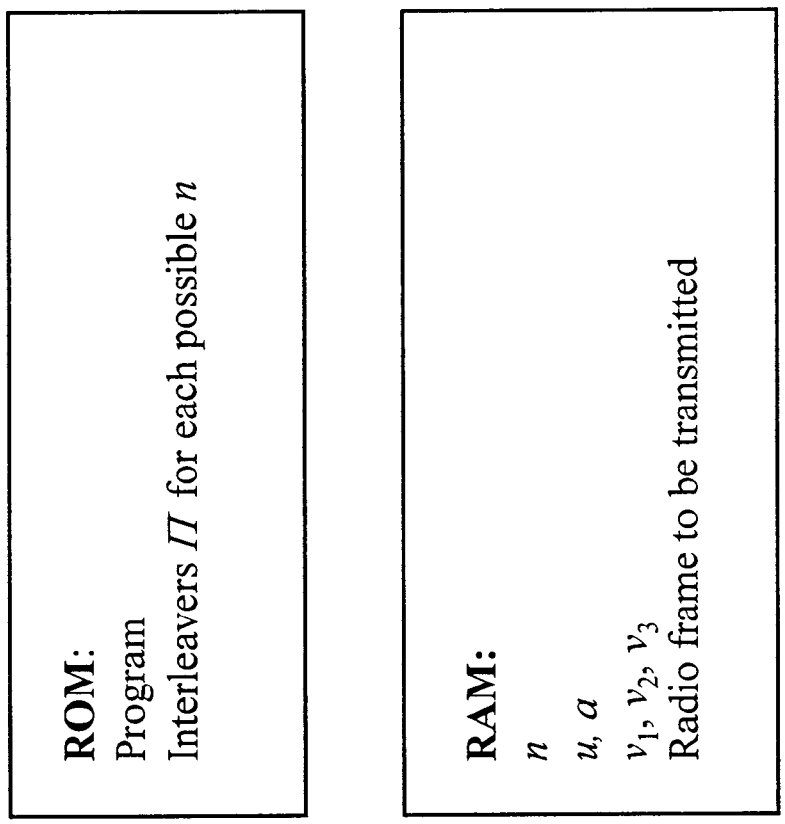

In FIG. 5, it should be noted that a first way of implementing the invention consists, in a coding and transmission device, of putting into non-volatile memory the positions in which are situated the symbols resulting from the permutation for each position in the permuted sequence, for each possible value of n.

Figure 6:
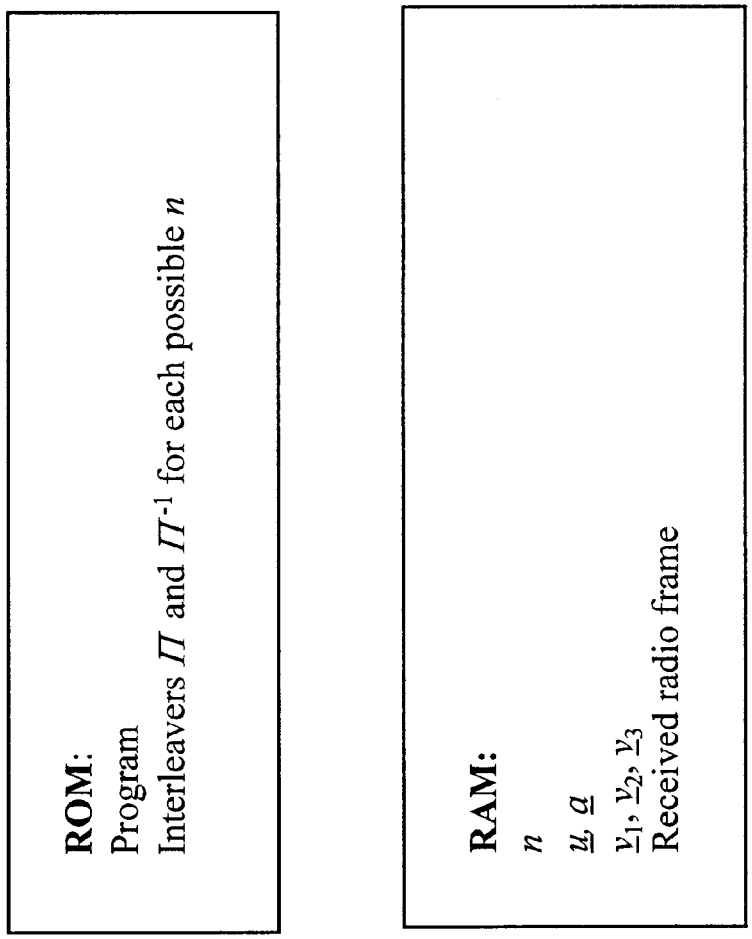

Similarly, in FIG. 6, it should be noted that a first way of implementing the invention consists, in a receiving and decoding device, of putting into non-volatile memory the positions in which are situated the symbols resulting from the permutation for each position in the permuted sequence, for each possible value of n and of putting into non-volatile memory the positions in which are situated the symbols resulting from the inverse permutation for each position in the sequence, for each possible value of n.

However, in a preferential embodiment of the present invention, illustrated in FIGS. 7 and 8, it is sufficient to put into non-volatile memory:

a value of e, for each possible value of n, in the coding and transmission device, and a value of e and the associated value $e^{-1}$ for each possible value of n, in the receiving and decoding device.

FIG. 9 illustrates schematically the composition of a network station or computer coding station, in block diagram form. This station has a keyboard 911, a screen 909, an external information source 910, a radio transmitter 906, jointly connected to an input/output port 903 of a processing card 901.

The processing card 901 has, interconnected by an address and data bus 902:

a central processing unit 900;

a random access memory RAM 904;

a non-volatile memory 905; and the input/output port 903.

Each of the elements illustrated in FIG. 9 is well known to persons skilled in the art of microcomputers and transmission systems and, more generally, information processing systems. These common elements are therefore not described here. It should be noted, however, that:

the information source 910 is, for example, an interface peripheral, a sensor, a demodulator, an external memory or another information processing system (not depicted), and is preferentially adapted to provide sequences of signals representing speech, service messages or multimedia data, in the form of sequences of binary data, the radio transmitter 906 is adapted to implement a packet transmission protocol on a wireless channel, and to transmit these packets on such a channel.

It should be noted, furthermore, that the word "register" used in the description designates, in each of the memories 904 and 905, both a memory area of small capacity (a few binary data items) and a memory area of large capacity (allowing storage of a complete program).

The random access memory 904 stores data, variables and intermediate processing results, in memory registers having, in the description, the same names as the data whose values they store. The random access memory 904 has notably the registers illustrated in FIG. 7:

a register "n" in which is stored the calculated value of n, according to the length of the sequence of data to be coded, a register "e" in which is stored the calculated value of e, according to the value of n, using the non-volatile memory 905, a register "interleaver" in which is stored the table defining the interleaver, according to the value of e, registers "$\underline{u}$", "$\underline{a}$" and "$\underline{a}$'", in which are respectively stored the sequence of data to be coded, $\underline{u}$, and the sequences resulting from the padding operation, $\underline{a}$, and then from the stuffing operation, $\underline{a}$', registers "$\underline{v}_1$", "$\underline{v}_1$'", "$\underline{v}_2$", "$\underline{v}'_2$" and "$\underline{v}_3$" in which are respectively stored the sequences $\underline{a}$', $\underline{a}$, and the sequences resulting from the turbocoding, a register "N0" storing the value of N0, a register "M", storing the value of M, and a register "radio_frame" in which is stored the whole of the radio frame to be transmitted (see FIG. 4).

The non-volatile memory 905 is adapted to store, in registers which, for convenience, have the same names as the data they store:

the operating program of the central processing unit 900, in a register "program", the sequence $\underline{g}$, in a register "$\underline{g}$", the sequence $\underline{h}$, in a register "$\underline{h}$", the table of values of e associated with the possible values of n.

Below is given an example of the table of values of e associated with a few possible values of n:

| n | e |
|---|---|
| 49 | 11 |
| 147 | 25 |
| 637 | 246 |

The central processing unit 900 is adapted to implement the flow diagram described in FIG. 11.

FIG. 10 illustrates schematically the composition of a network station or computer coding station, in block diagram form. This station has a keyboard 1011, a screen 1009, an external information destination 1010, a radio receiver 1006, jointly connected to an input/output port 1003 of a processing card 1001.

The processing card 1001 has, interconnected by an address and data bus 1002:

a central processing unit 1000 a random access memory RAM 1004;

a non-volatile memory 1005; and the input/output port 1003.

Each of the elements illustrated in FIG. 10 is well known to persons skilled in the art of microcomputers and transmission systems and, more generally, information processing systems. These common elements are therefore not described here. It should be noted, however, that:

the information destination 1010 is, for example, an interface peripheral, a display, a modulator, an external memory or another information processing system (not depicted), and is preferentially adapted to receive sequences of signals representing speech, service messages or multimedia data, in the form of sequences of binary data, the radio receiver 1006 is adapted to implement a packet transmission protocol on a wireless channel, and to transmit these packets on such a channel.

It should be noted, furthermore, that the word "register" used in the description designates, in each of the memories 1004 and 1005, both a memory area of small capacity (a few binary data items) and a memory area of large capacity (allowing storage of a complete program).

The random access memory 1004 stores data, variables and intermediate processing results, in memory registers having, in the description, the same names as the data whose values they store. The random access memory 1004 has notably the registers illustrated in FIG. 8:

- a register "n" in which is stored the calculated value of n, according to the length of the sequences of coded data,
- a register "e" in which is stored the calculated value of e, according to the value of n, using the non-volatile memory 1005,
- a register "$e^{-1}$" in which is stored the calculated value of $e^{-1}$, according to the value of n, using the non-volatile memory 1005,
- a register "interleaver" in which is stored the table defining the interleaver, according to the value of e,
- a register "inverse interleaver" in which is stored the table defining the interleaver, according to the value of $e^{-1}$,
- registers "$\underline{v}'_1$", "$\underline{v}'_2$" and "$\underline{v}_3$", in which are respectively stored the received sequences,
- registers "$\underline{w}_1$", "$\underline{w}_2$", "$\underline{w}_3$" and "$\underline{w}_4$", in which are respectively stored the intermediate decoding sequences (see FIG. 3),
- a register "$\underline{a}'$", in which is stored the decoded sequence,
- a register "i", in which is stored the value of an intermediate processing variable i,
- a register "N0" storing the value of N0,
- a register "M", storing the value of M, and
- a register "radio_frame" in which is stored the whole of the received radio frame (see FIG. 4).

The non-volatile memory 1005 is adapted to store, in registers which, for convenience, have the same names as the data they store:

- the operating program of the central processing unit 1000, in a register "program",
- the sequence $\underline{g}$, in a register "$\underline{g}$",
- the sequence $\underline{h}$, in a register "$\underline{h}$",
- the table of values of e associated with the possible values of n, and
- the table of values of $e^{-1}$ associated with the possible values of n.

Below is given an example of the table of values of e associated with a few possible values of n:

| n | e |
|---|---|
| 49 | 11 |
| 147 | 25 |
| 637 | 246 |

Below is given an example of the table of values of $e^{-1}$ associated with the same values of n:

| n | $e^{-1}$ |
|---|---|
| 49 | 9 |
| 147 | 100 |
| 637 | 246 |

The central processing unit 1000 is adapted to implement the flow diagram described in FIG. 12.

In FIG. 11, it should be noted that, following an initialization operation 1101 of a type known to persons skilled in the art of systems having a central unit, during an operation 1102, the central unit 900 waits for a sequence of symbols to be coded to be transmitted to it by the information source 910. It should be noted here that the end of this sequence is marked, either by a fairly long delay before another symbol is transmitted, or by information items having particular values which signify that the sequence is complete.

Next, during an operation 1103, the central unit 900 determines the number n' of symbols in the sequence which are to be transmitted, extracting the symbols which are not intended to be transmitted, according to known procedures.

Then, during an operation 1104, the central unit performs a padding operation during which, at the end of the sequence of symbols to be transmitted, a number of binary symbols, equal to the degree of the divisor polynomial g(x), is added in order that the polynomial representation of this sequence is divisible by the polynomial g(x).

Then, in parallel:
- a stuffing operation 1105 is performed, during which binary symbols of null value are added to the end of the sequence resulting from the padding operation, in order that the number n of binary symbols in the final sequence is an odd multiple of the number N0, which is, it should be noted, the smallest value such that the polynomial $x^{N0}+1$ is divisible by the polynomial g(x);
- an interleaver generation operation 1106 is performed in accordance with one of the procedures illustrated in FIGS. 13 or, preferentially, 14, taking into account the number e which is associated, in non-volatile memory 905, with the value of the length n.

Next, the sequence resulting from the stuffing operation 1105 is turbocoded during a turbocoding operation 1107 using the interleaver generated during the operation 1106, the divisor polynomial g(x) and the multiplier polynomial h(x).

Then, during a stuffing bit removal operation 1108:
- the stuffing bits are taken away at the end of the sequence $\underline{v}_1$ and
- the parity bits corresponding to these stuffing bits are taken away at the end of the sequence $\underline{v}_2$, in order to form, respectively, the sequences $\underline{v}'_1$, and $\underline{v}'_2$.

Finally, during an operation 1109, the sequences $\underline{v}'_1$, $\underline{v}'_2$ and $\underline{v}_3$ are inserted into radio frames, they modulate electromagnetic signals and are transmitted on a radio channel.

The operation 1102 is next reiterated.

In FIG. 12, it should be noted that, following an initialization operation 1201 of a type known to persons skilled in the art of systems having a central unit, during an operation 1202, the central unit 1000 waits for a radio frame to be transmitted to it by the coding and transmission device. It should be noted here that the end of this radio frame is marked, by information items having particular values.

Next, during an operation 1203, the central unit 1000 determines the number 3n−2s of symbols in the radio frame which are to be decoded, extracting the symbols which are not intended to be decoded, according to known procedures.

During the same operation 1203, the central unit 1000 determines the value of n and that of s, considering that n is an odd multiple of 7 and that s<14.

Then, in parallel:
- during an operation 1204, the central unit 1000 performs a "stuffing" operation on the first two sequences to be decoded, adding to them stuffing bits and the corresponding parity bits assigned the highest possible reliability value corresponding to a null hard bit in such a way that the length of the resulting sequence is equal to n, and during an operation 1205, the central unit 1000 performs the generation of the interleaver and of the inverse interleaver, taking into account the value of e and that of $e^{-1}$, which are associated with the value of n, in non-volatile memory 1005.

Next, during an operation 1206, the three sequences coming, for the first two, from the stuffing operation 1204 and, for the last, from the operation 1203, are decoded using the interleavers generated during the operation 1205, the divisor polynomial g(x) and the multiplier polynomial h(x). This operation provides an estimate of the sequence $\underline{a}'$.

Then, during an operation 1207, the symbols added during the stuffing operation 1204 and those coming from a padding operation performed at coding (see operation 1104), and which, for the latter, are equal in number to the degree of the divisor polynomial g(x), are taken away from the sequence $\underline{a}'$ in order to form the transmitted sequence $\underline{u}$. Finally, the transmitted sequence $\underline{u}$ is delivered to the information destination 1210 and the operation 1202 is reiterated.

It should be noted in FIG. 13 that, for generating an interleaver, the central unit 900 first of all performs an initialization operation 1301, during which it sets to zero all values in the register "interleaver" as well as an intermediate variable i, and takes into account the value of n and the value of e which corresponds to it in the table stored in non-volatile memory 905.

Next, during an operation 1302, the value of the i-th data item stored in the interleaver is calculated as being equal to the value of i multiplied by e, modulo n. Next, during an operation 1303, the central unit 900 increments the value of the variable i by 1. Then, during a test 1304, the central unit 900 determines whether or not the value of the variable i is equal to n−1.

When the result of the test 1304 is negative, the operation 1302 is reiterated. When the result of the test 1304 is positive, the interleaver generation operation 1106 is complete.

In FIG. 14 should be noted a preferential procedure, followed by the central unit 900 for generating the interleaver, reducing the complexity of the calculations performed and therefore the calculating power necessary for implementing the present invention.

The operations illustrated in FIG. 14 are identical to those illustrated in FIG. 13, with the exception of the operation 1302 which is replaced by an operation 1402 during which the content of the (i+1)-th position of the interleaver is calculated as being equal to the content of the i-th position to which e is added, the operation being performed modulo n.

It should be understood that a simple addition here replaces a multiplication, which simplifies this operation 1402 and can considerably reduce its duration, compared with the operation 1302.

According to a variant, not depicted, the selection criterion which is used for choosing the interleaver which guarantees the return to zero and the generator polynomials, is no longer the length of the input sequence, but the type of transmission channel used between the coding device and the decoding device, the quality of this channel, the transmission quality to be guaranteed, the type of data (audio, video, data, etc) which is represented by the symbols to be coded, etc.

By way of example, if the channel is of poor quality (poor signal/noise ratio), or if the guaranteed quality has to be high, the degree of at least one of the generator polynomials (multiplier or divisor) will be chosen higher for the mean value selection criteria.

As a variant, the same value of e, for example 32, is chosen for all possible values of n.

In a variant, not depicted, the coding is performed by concatenation in the following manner:

Let:
g(x) be the divisor polynomial of a turbocoder;
N0 be the smallest integer such that g(x) is a divisor of the polynomial $x^{N0}+1$; and
n be an odd multiple of N0: n=M N0.
g(x) being a "polynomial without square divisor", N0 is an odd number.

In this variant, the divisor polynomial g(x) and multiplier polynomial h(x) act on the so-called "concatenated" sequence containing successively:

a sequence $\underline{u}$ of n binary symbols $u_j$, and then an interleaved sequence $\underline{u}^*$ produced according to the following rule:
$u^*(x)=u(x^e)$ modulo $x^n+1$, for any value of e which is a power of 2, for which the residue of e modulo N0 is equal to 1 and therefore defined by its polynomial representation, $uu^*(x)=u(x)+x^n u^*(x)$.

It should be noted that the multiplier polynomial h(x) is, preferentially, of degree less than or equal to that of g(x) for this type of turbocoding.

The implementation of the present invention makes it possible to determine the following transmission parameters:

the divisor polynomial g(x), the multiplier polynomial h(x), the value of e, the length n of the sequence $\underline{u}$.

according to the selection criteria described above.

What is claimed is:

1. A coding method which takes into account at least one selection criterion related to a transmission of binary symbols representing a physical quantity, comprising:

an operation, of selecting transmission parameters, according to at least one selection criterion, each selected transmission parameter being in the set of parameters comprising:
a number K, greater than or equal to 1, of sequences $a_i$ (i=1, . . . , K) of binary symbols, to be coded,
an integer M1, equal to or greater than 2,
a divisor polynomial $g_i(x)$,
an integer M,
an interleaver, and
a multiplier polynomial $f_{ij}(x)$, an operation, of inputting the number K of sequences $a_i$ (i=1, . . . ,K) of binary data, each sequence $a_i$ having:
a polynomial representation $a_i(x)$ which is a multiple of a polynomial $g_i(x)$, and
a number of binary data items equal to a product of the integer number M and the integer N0, the smallest integer such that the polynomial $x^{N0}+1$ is divisible by each divisor polynomial $g_i(x)$;

a first production operation, for a number K*M1 of permuted sequences, $a_{ij}^*$, (i=1, . . . ,K; j=1, . . . ,M1), each sequence $a_{ij}^*$:
being obtained by a permutation of the corresponding sequence $a_i$, the permutation being, in a representation where binary data items of each sequence $a_i$ are written, row by row, into a table with N0 columns and M rows, a result of any number of elementary permutations, each of which:
  either has a property of transforming a cyclic code of length N0 and with generator polynomial $g_i(x)$ into an equivalent cyclic code with generator polynomial $g_{ij}(x)$ which may be equal to $g_i(x)$, and acts by permutation on the N0 columns of the table representing $a_i$,
  or is any permutation of the symbols of a column of the table;
  having, in consequence, a polynomial representation $a_{ij}*(x)$ which is equal to a polynomial product $c_{ij}(x) g_{ij}(x)$,
  at least one permuted sequence $a_{ij}*$ being different from the corresponding sequence $a_i$, and
a second production operation, for M1 redundant sequences, the polynomial representation of which is equal to $\Sigma\ f_{ij}(x)\ c_{ij}(x)$, for j=1, . . . , M1, each polynomial $f_{ij}(x)$ being a polynomial of a degree at most equal to the degree of the polynomial $g_{ij}(x)$ with the same indices i and j.

2. The method according to claim 1, in which the input operation includes an operation of adding, to each of K sequences $u_i$(i=1, . . . , K), additional binary symbols in order to produce the sequence $a_i$.

3. The method according to claim 2, in which, during the addition operation, there are added, to each sequence $u_i$, padding additional data items, a number of which is equal to the degree of the divisor polynomial g(x), and which guarantee a divisibility of the polynomial representation of the sequence resulting from the addition operation by the divisor polynomial g(x).

4. The method according to either one of claims 2 or 3, in which the addition operation includes a stuffing operation during which are added stuffing additional data items, of predetermined value, which guarantee that the number n of symbols of the binary sequence resulting from the stuffing operation meets the conditions of being:
  greater than or equal to (n'+m),
  a multiple of N0, the smallest integer such that $x^{N0}+1$ is divisible by g(x), and
  odd.

5. The method according to claim 4, in which at least one of the sequences resulting from the coding operation is not subject to any interleaving, the method having an operation of removing data items from at least one sequence resulting from the coding operation not having been subject to any interleaving.

6. The method according to claim 1, in which the input operation includes an operation of reading each of K sequences $u_i$(i=1, . . . , K) in order to produce the sequence $a_i$.

7. The method according to any one of claims 2, 3, or 6, in which, during the transmission parameter selection operation, the length of the sequence u of symbols $u_i$ to be coded is taken into account.

8. The method according to any one of claims 1–3 or 6, in which, during the transmission parameter selection operation, a coded sequence transmission channel is taken into account.

9. The method according to claim 8, in which, during the transmission parameter selection operation, a signal-to-noise ratio of the coded sequence transmission channel is taken into account.

10. The method according to any one of claims 1–3 or 6, in which, during the transmission parameter selection operation, a type of data represented by the symbols to be coded is taken into account.

11. The method according to any one of claims 1–3 or 6, in which, during the transmission parameter selection operation, a guaranteed quality of service for the transmission of the symbols to be coded is taken into account.

12. The method according to any one of claims 1–3 or 6, in which, during the transmission parameter selection operation, a coding efficiency is taken into account.

13. The method according to any one of claims 1–3 or 6, in which, during the first production operation for a number K*M1 of permuted sequences, $a_{ij}*$, (i=1, . . . ,K; j=1, . . . , M1), each sequence $a_{ij}*$ has a polynomial representation equal to $a_{ij}*(x)=a_i*(x^{e_{ij}})$, modulo $(x^n+1)$, where
  n is a product of the number M and the integer N0,
  $e_{ij}$ is a number relatively prime with n,
  the polynomial $g_{ij}(x)$ is the generator polynomial of a smallest cyclic code of length N0 containing the polynomial $g_i(x^{e_{ij}})$ modulo $(x^{N0}+1)$.

14. The method according to claim 13, in which, during the transmission parameter selection operation, a value of the exponent e is selected, as a function of at least one selection criterion.

15. The method according to claim 13, having an interleaver generation operation, the interleaver defining the permutations performed during the first production operation, and during the generation operation, the interleaver is constituted by the iterative implementation of an addition operation, modulo a predetermined number.

16. The method according to any one of claims 1–3 or 6, wherein the method takes into account:
  a value of K equal to 1,
  polynomial without square $g_1(x)$,
  N0, the smallest integer such that $g_1(x)$ is a divisor of the polynomial $x^{N0}+1$;
  n, an odd multiple of N0;
  a sequence u of n symbols $u_i$ to be coded; and
  e, a power of 2, for which a residue of e modulo N0 is equal to 1,
  and further comprises:
    an operation, of composing a concatenated sequence uu* composed successively, of the sequence of symbols u, having n symbols, and, of a sequence of symbols u* defined by its polynomial representation, $u*(x)=u(x^e)$ modulo $x^n+1$, and
    a coding operation, including at least one division of the concatenated sequence uu* by the polynomial $g_1(x)$ in order to form a check sequence.

17. A decoding method, which takes into account at least one selection criterion related to a transmission of binary symbols representing a physical quantity, comprising:
  an operations of selecting transmission parameters, according to at least one selection criterion, each selected transmission parameter being in a set of parameters comprising:
    an integer M1, equal to 2,
    a number K, greater than or equal to 1, of sequences $v_i$ (i=1, . . . , K+M1) of symbols to be decoded,
    a divisor polynomial $g_i(x)$,
    an integer M,
    an interleaver/de-interleaver pair, and
    a multiplier polynomial $f_{ij}(x)$,
  an operation, of inputting the number K+M1 of sequences $v'_i$(i=1, . . . ,K+M1) of symbols to be decoded,
  an operation, of decoding K sequences of symbols using the divisor polynomials $g_{ij}(x)$, the sad decoding operation providing K decoded sequences, and a permutation operation, the permutation being, in a representation where binary data items of each sequence $v_i$ are written, row by row, into a table with N0 columns and M rows, a result of any number of elementary permutations, each of which:

either has the property of transforming a cyclic code of length N0 and with generator polynomial $g_i(x)$ into an equivalent cyclic code with generator polynomial $g_{ij}(x)$ which may be equal to $g_i(x)$, and acts by permutation on the N0 columns of the table representing $a_i$, or is any permutation of the symbols of a column of the table, at least one permuted sequence $a_{ij}*$ being different from the corresponding sequence $a_i$.

18. The method according to claim 17, having, following the decoding operation, an operation of removing, from each decoded sequence $a_i$ (i=1, . . . , K), additional binary symbols, in order to produce a transmitted information sequence $u_i$.

19. The method according to claim 18, in which the removing operation includes an operation of removing stuffing additional data items, of predetermined value, which guarantee that a number n of symbols in a binary sequence resulting from the stuffing operation meets the conditions of being:

greater than or equal to (n'+m), a multiple of N0, the smallest integer such that $x^{N0}+1$ is divisible by g(x), and odd.

20. The method according to any one of claims 17 to 19, in which, during the transmission parameter selection operation, a length of the transmitted sequence is taken into account.

21. The method according to any one of claims 17 to 19, in which, during the transmission parameter selection operation, a coded sequence transmission channel is taken into account.

22. The method according to claim 21, in which, during the transmission parameter selection operation, the signal-to-noise ratio of the coded sequence transmission channel is taken into account.

23. The method according to any one of claims 17 to 19, in which, during the transmission parameter selection operation, a type of data represented by the symbols to be coded is taken into account.

24. The method according to any one of claims 17 to 19, in which, during the transmission parameter selection operation, a guaranteed quality of service for the transmission of the symbols to be coded is taken into account.

25. The method according to any one of claims 17 to 19, in which, during the transmission parameter selection operation, a coding efficiency is taken into account.

26. The method according to any one of claims 17 to 19, in which, during the permutation operation, a number K*M1 of permuted sequences, $a_{ij}*$, (i=1, . . . ,K; j=1, . . . ,M1) are produced, each sequence $a_{ij}*$ having a polynomial representation equal to $a_{ij}*(x)=a_i*(x^{eij})$, modulo $(x^n+1)$, where n is a product of the number M and the integer N0, $e_{ij}$ is a number relatively prime with n, the polynomial $g_{ij}(x)$ is the generator polynomial of a smallest cyclic code of length N0 containing the polynomial $g_i(x^{eij})$ modulo $(x^{N0}+1)$.

27. The method according to claim 26, in which, during the transmission parameter selection operation, a value of the exponent e is selected, according to at least one selection criterion.

28. The method according to claim 26, in further comprising an interleaver generation operation, the interleaver defining the permutations performed during the first production operation, and during the generation operation, the interleaver is constituted by the iterative implementation of an addition operation, modulo a predetermined number.

29. The method according to any one of claims 17 to 19, which takes into account:

a value of K equal to 1, polynomial without square g(x),

N0, the smallest integer such that g(x) is a divisor of the polynomial $x^{N0}+1$;

n, an odd multiple of N0;

a sequence $\underline{u}$ of n symbols $u_i$ to be coded; and e, a power of 2, for which the residue of e modulo N0 is equal to 1, wherein the operation of permutation of a sequence $\underline{u}$ into a sequence u* is defined by a polynomial representation, $u*(x)=u(x^e)$ modulo $x^n+1$.

30. A coding device, comprising a processing means, adapted to:

take into account at least one selection criterion related to a transmission of binary symbols representing a physical quantity, select at least one transmission parameter, according to at least one selection criterion, each selected transmission parameter being in a set of parameters comprising:

a number K, greater than or equal to 1, of sequences $a_i$ (i=1, . . . , K) of binary symbols, to be coded, an integer M1, equal to or greater than 2, a divisor polynomial $g_i(x)$, an integer M, an interleaver, and a multiplier polynomial $f_{ij}(x)$;

receive a number K of sequences $a_i$ (i=1, . . . ,K) of binary data, each sequence $a_i$ having:

a polynomial representation $a_i(x)$ which is a multiple of a polynomial $g_i(x)$, and a number of binary data items equal to a product of the integer number M and the integer N0, the smallest integer such that the polynomial $x^{N0}+1$ is divisible by each divisor polynomial $g_i(x)$;

produce a number K*M1 of permuted sequences, $a_{ij}*$, (i=1, . . . ,K j=1, . . . ,M1), each sequence $a_{ij}*$:

being obtained by a permutation of the corresponding sequence $a_i$, the permutation being, in a representation where binary data items of each sequence $a_i$ are written, row by row, into a table with N0 columns and M rows, a result of any number of elementary permutations, each of which:

either has a property of transforming a cyclic code of length N0 and with generator polynomial $g_i(x)$ into an equivalent cyclic code with generator polynomial $g_{ij}(x)$ which may be equal to $g_i(x)$, and acts by permutation on the N0 columns of the table representing $a_i$, or is any permutation of the symbols of a column of the table; and having, in consequence, a polynomial representation $a_{ij}*(x)$ which is equal to a polynomial product $c_{ij}(x) g_{ij}(x)$, at least one permuted sequence $a_{ij}*$ being different from the corresponding sequence $a_i$, produce M1 redundant sequences, the polynomial representation of which is equal to $\Sigma\ f_{ij}(x)\ c_{ij}(x)$, for j=1, . . . ,M1, each polynomial $f_{ij}(x)$ being a polynomial of degree at most equal to the degree of the polynomial $g_{ij}(x)$ with the same indices i and j.

31. The device according to claim 30, in which the processing means is adapted to add, to each of K sequences $u_i$(i=1, . . . , K), additional binary symbols in order to produce the sequence $a_i$.

32. The device according to claim 31, in which said processing means is adapted to add, to each sequence $u_i$, padding additional data items, a number of the padding additional items being equal to a degree of the divisor polynomial g(x), and the padding additional items guaranteeing the divisibility of the polynomial representation of the sequence resulting from the addition operation by the divisor polynomial g(x).

33. The device according to either one of claims 31 or 32, in which the processing means is adapted to add stuffing additional data items, of predetermined value, which guarantee that a number n of symbols of the binary sequence resulting from the stuffing operation meets the conditions of being:
   greater than or equal to (n'+m),
   a multiple of N0, the smallest integer such that $x^{N0}+1$ is divisible by g(x), and
   odd.

34. The device according to claim 33, in which the processing means is adapted, in that at least one of the sequences resulting from the coding operation is not subject to any interleaving, to take away data items from at least one sequence resulting from the coding operation not having been subject to any interleaving.

35. The device according to claim 30, in which the processing means is adapted to read, from an information source, each of K sequences $u_i$ (i=1, . . . , K) in order to produce the sequence $a_i$.

36. The device according to any one of claims 31, 32, or 35, in which the processing means is adapted to take into account a length of a sequence $\underline{u}$ of symbols $u_i$ to be coded for selecting the transmission parameters.

37. The device according to any one of claims 30–32 or 35, in which the processing means is adapted to take into account a coded sequence transmission channel for selecting the transmission parameters.

38. The device according to claim 37, in which the processing means is adapted to take into account the a signal-to-noise ratio of the coded sequence transmission channel for selecting the transmission parameters.

39. The device according to any one of claims 30–32 or 35, in which the processing means is adapted to take into account the type of data represented by the symbols to be coded for selecting the transmission parameters.

40. The device according to any one of claims 30–32 or 35, in which the processing means is adapted to take into account a guaranteed quality of service for the transmission of the symbols to be coded for selecting the transmission parameters.

41. The device according to any one of claims 30–32 or 35, in which the processing means is adapted to take into account a coding efficiency for selecting the transmission parameters.

42. The device according to any one of claims 30–32 or 35, in which the processing means is adapted, for producing the number K*M1 of permuted sequences, $a_{ij}^*$, (i=1, . . . ,K; j=1, . . . ,M1), such that each sequence $a_{ij}^*$ has a polynomial representation equal to $a_{ij}^*(x)=a_i^*(x^{e_{ij}})$, modulo $(x^n+1)$, where
   n is the product of the number M and the integer N0,
   $e_{ij}$ is a number relatively prime with n,
   the polynomial $g_{ij}(x)$ is the generator polynomial of a smallest cyclic code of length N0 containing the polynomial $g_i(x^{e_{ij}})$ modulo $(x^{N0}+1)$.

43. The device according to claim 42, in which the processing means is adapted, for selecting transmission parameters, to select a value of the exponent e, according to at least one selection criterion.

44. The device according to claim 42, in which the processing means is adapted to generate an interleaver, the interleaver defining the permutations performed to produce the permuted sequences, the generated interleaver being constituted by the iterative implementation of an addition operation, modulo a predetermined number.

45. The device according to any one of claims 30–32 or 35, in which the processing means is adapted:
   to take into account:
      a value of K equal to 1,
      a polynomial without square $g_i(x)$,
      N0, the smallest integer such that $g_i(x)$ is a divisor of the polynomial $x^{N0}+1$;
      n, an odd multiple of N0;
      a sequence $\underline{u}$ of n symbols $\underline{u}_i$ to be coded; and
      e, a power of 2, for which the residue of e modulo N0 is equal to 1,
   to compose a concatenated sequence uu* composed successively of the sequence of symbols u, having n symbols, and, of a sequence of symbols u* defined by its polynomial representation, $u^*(x)=u(x^e)$ modulo $x^n+1$,
   to code the concatenated sequence uu* by implementing at least one division by the polynomial $g_i(x)$ in order to form a check sequence.

46. A decoding device, comprising processing means adapted:
   to take into account at least one selection criterion related to a transmission of binary symbols representing a physical quantity;
   to select at least one transmission parameter, according to at least one selection criterion, each selected transmission parameter being in a set of parameters comprising:
      an integer M1, equal to 2,
      a number K, greater than or equal to 1, of sequences $v_i$ (i=1, . . . , K+M1) of symbols to be decoded,
      a divisor polynomial $g_i(x)$,
      an integer M,
      an interleaver/de-interleaver pair, and
      a multiplier polynomial $f_{ij}(x)$;
   to receive a number K+M1 of sequences $v'_i$ (i=1, . . . ,K+M1) of symbols to be decoded;
   to decode K sequences of decoded symbols using the divisor polynomials $g_{ij}(x)$;
   to perform a permutation, the permutation being, in a representation where binary data items of each sequence $v_i$ are written, row by row, into a table with N0 columns and M rows, a result of any number of elementary permutations, each of which:
      either has the property of transforming a cyclic code of length N0 and with generator polynomial $g_i(x)$ into an equivalent cyclic code with generator polynomial $g_{ij}(x)$ which may be equal to $g_i(x)$, and acts by permutation on the N0 columns of the table representing $a_i$,
      or is any permutation of the symbols of a column of the table;
   at least one permuted sequence $a_{ij}^*$ being different from the corresponding sequence $a_i$.

47. The device according to claim 46, in which the processing means is adapted, following the decoding, to take away, from each decoded sequence $a_i$ (i=1, ..., K), at least one additional binary symbol, in order to produce a transmitted information sequence $u_i$.

48. The device according to claim 47, in which the processing means is adapted to take away at least one stuffing additional data item, of predetermined value, which guarantee that a number n of symbols of the binary sequence resulting from the stuffing operation meets the conditions of being:
   greater than or equal to (n'+m),
   a multiple of N0, the smallest integer such that $x^{N0}+1$ is divisible by g(x), and
   odd.

49. The device according to any one of claims 46 to 48, in which the processing means is adapted to take into account a length of the transmitted sequence for selecting the transmission parameters.

50. The device according to any one of claims 46 to 48, in which the processing means is adapted to take into account a coded sequence transmission channel for selecting the transmission parameters.

51. The device according to claim 50, in which the processing means is adapted to take into account a signal/noise signal-to-noise ratio of the coded sequence transmission channel for selecting the transmission parameters.

52. The device according to any one of claims 46 to 48, in which the processing means is adapted to take into account a type of data represented by the symbols to be coded for selecting the transmission parameters.

53. The device according to any one of claims 46 to 48, in which the processing means is adapted to take into account a guaranteed quality of service for the transmission of the symbols to be coded for selecting the transmission parameters.

54. The device according to any one of claims 46 to 48, in which the processing means is adapted to take into account a coding efficiency for selecting the transmission parameters.

55. The device according to any one of claims 46 to 48, in which, during the permutation operation, a number K*M1 of permuted sequences, $a_{ij}^*$, (i=1, ..., K; j=1, ..., M1) are produced, each sequence $a_{ij}^*$ having a polynomial representation equal to $a_{ij}^*(x)=a_i^*(x^{eij})$, modulo $(x^n+1)$, where
   n is a product of the number M and the integer N0,
   $e_{ij}$ is a number relatively prime with n, and
   the polynomial $g_{ij}(x)$ is the generator polynomial of a smallest cyclic code of length N0 containing the polynomial $g_i(x^{eij})$ modulo $(x^{N0}+1)$.

56. The device according to claim 55, in which the processing means is adapted to select a value of the exponent e, as a transmission parameter, according to at least one selection criterion.

57. The device according to claim 55, in which the processing means is adapted to generate an interleaver defining the permutations performed during a first production operation, the interleaver being constituted by an iterative implementation of an addition operation, modulo a predetermined number.

58. The device according to any one of claims 46 to 48, in which the processing means is adapted:
   to take into account:
      a value of K equal to 1,
      a polynomial without square g(x),
      N0, the smallest integer such that g(x) is a divisor of the polynomial $x^{N0}+1$;
      n, an odd multiple of N0;
      a sequence $\underline{u}$ of n symbols $\underline{u}_i$ to be coded; and
      e, a power of 2, for which the residue of e modulo N0 is equal to 1; and
   to perform the operation of permutation of a sequence $\underline{u}$ into a sequence $\underline{u}^*$ according to a relationship of polynomial representation: $u^*(x)=u(x^e)$ modulo $x^n+1$.

59. An information processing device, comprising:
   first coding means for inputting a first sequence represented by a multiple of a predetermined polynominal and producing a second sequence;
   permuting means for producing a permuted sequence represented by the multiple of the predetermined polynomial by permuting the first sequence;
   second coding means for inputting the permuted sequence and producing a third sequence; and
   controlling means for controlling said permuting means in accordance with a data length of the first sequence.

60. The device according to claim 59, in which the data length of the first sequence varies in accordance with the predetermined polynomial.

61. The device according to either one of claims 59 or 60, in which said controlling means modifies the permutation operation performed by said permuting means in accordance with the data length of the first sequence.

62. The device according to any one of claims 59 or 60, in which said controlling means further modifies the permutation operation performed by said permuting means in accordance with a type of information included in the first sequence.

63. The device according to any one of claims 59 or 60, in which said controlling means further modifies the permutation operation performed by said permuting means in accordance with a condition of transmission.

64. The device according to any one of claims 59 or 60, in which the first sequence includes at least one of audio information, character information and image information.

65. The device according to any one of claims 59 or 60, wherein said device performs turbocoding of the first sequence.

66. The device according to any one of claims 59 or 60, wherein the device is a data communication device.

67. The device according to any one of claims 59 or 60, wherein the device is a wireless communication device.

68. An information processing method, comprising:
   a first coding step, of inputting a first sequence represented by a multiple of a predetermined polynomial and producing a second sequence;
   a permuting step, of producing a permuted sequence represented by the multiple of the predetermined polynomial by permuting the first sequence;
   a second coding step, of inputting the permuted sequence and producing a third sequence; and
   a controlling step, of controlling said permuting step in accordance with a data length of the first sequence.

69. A storage medium readable by a computer, storing a program for performing:
   a first coding process, of inputting a first sequence represented by a multiple of a predetermined polynomial and producing a second sequence;
   a permuting process, of producing a permuted sequence represented by the multiple of the predetermined polynomial by permuting the first sequence;
   a second coding process, of inputting the permuted sequence and producing a third sequence; and a controlling process, of controlling said permuting process in accordance with a data length of the first sequence.

70. An information processing device, comprising:

first decoding means for inputting a first sequence and a second sequence which is represented by a multiple of a predetermined polynomial;

first permuting means for permuting an output of said first decoding means;

second decoding means for inputting the output of said second decoding means and a third sequence represented by the multiple of the predetermined polynomial;

second permuting means for permuting the output of said second decoding means and supplying a result of the permutation to said first decoding means; and controlling means for controlling said first permuting means and said second permuting means in accordance with a data length of the first sequence.

71. The device according to claim 70, in which the data length of the first sequence varies in accordance with said predetermined polynomial.

72. The device according to either one of claims 70 or 71, in which said controlling means modifies the permutation operation performed by said first permuting means and the permutation operation performed by said second permuting means in accordance with the data length of the first sequence.

73. The device according to any one of claims 70 or 71, in which said controlling means further modifies the permutation operation performed by said first permuting means and the permutation operation performed by said second permuting means in accordance with a type of information included in the first sequence.

74. The device according to any one of claims 70 or 71, in which said controlling means further modifies the permutation operation performed by said first permuting means and the permutation operation performed by said second permuting means in accordance with a condition of transmission.

75. A device according to any one of claims 70 or 71, in which the first sequence includes at least one of audio information, character information and image information.

76. The device according to any one of claims 70 or 71, wherein said device performs turbodecoding of the first sequence.

77. The device according to any one of claims 70 or 71, wherein said device is a data communication device.

78. The device according to any one of claims 70 or 71, wherein said device is a wireless communication device.

79. An image processing method, comprising:

a first decoding step, of inputting a first sequence and a second sequence which is represented by a multiple of a predetermined polynomial;

a first permuting step, of permuting an output of said first decoding step;

a second decoding step, of inputting an output of said first permuting step and a third sequence represented by the multiple of the predetermined polynomial;

a second permuting step, of permuting an output of said second decoding step and supplying a result of said permutation to said first decoding step; and a controlling step, of controlling said first permuting step and said second permuting step in accordance with a data length of the first sequence.

80. A storage medium readable by a computer, stores a program for performing:

a first decoding process, of inputting a first sequence and a second sequence which is represented by a multiple of a predetermined polynomial;

a first permuting process, of permuting an output of said first decoding process;

a second decoding process, of inputting an output of said first permuting process and a third sequence represented by the multiple of the predetermined polynomial;

a second permuting process, of permuting an output of said second decoding process and supplying a result of said permutation to said first decoding process; and a controlling process, of controlling said first permuting process and said second permuting process in accordance with a data length of the first sequence.

* * * * *

UNITED STATES PATENT AND TRADEMARK OFFICE
CERTIFICATE OF CORRECTION

PATENT NO. : 6,766,489 B1
APPLICATION NO. : 09/435351
DATED : July 20, 2004
INVENTOR(S) : Philippe Piret et al.

It is certified that error appears in the above-identified patent and that said Letters Patent is hereby corrected as shown below:

COLUMN 6:

Line 7, "(j=1," should read --(i=1,--.

COLUMN 8:

Line 15, "$(x^{NO}+1)$," should read --$(x^{NO}+1)$.--.

COLUMN 9:

Line 28, "sequences." should read --sequences, and--.

COLUMN 13:

Line 11, "next decoded." should read --decoded next.--; and
    Line 44, "$a_i$," should read --$a_i$, and--.

COLUMN 14:

Line 49, "etc)," should read --etc.),--.

COLUMN 18:

Line 7, "$\underline{v}_1$'"," should read --"$\underline{v}'_1$",--, and
    Line 45, "1000" should read --1000;--.

COLUMN 20:

Line 40, "$\underline{v}_1$ and" should read --$\underline{v}_1$, and--.

COLUMN 21:

Line 64, "etc)" should read --etc.)--.

COLUMN 22:

Line 12, "N0." should read --N0--;
    Line 18, "$u_j$," should read --$u_i$,--; and
    Line 35, "$\underline{u}$." should read --$\underline{u}$,--.

UNITED STATES PATENT AND TRADEMARK OFFICE
CERTIFICATE OF CORRECTION

PATENT NO. : 6,766,489 B1
APPLICATION NO. : 09/435351
DATED : July 20, 2004
INVENTOR(S) : Philippe Piret et al.

It is certified that error appears in the above-identified patent and that said Letters Patent is hereby corrected as shown below:

COLUMN 24:

Line 31, "polynomial" should read --a polynomial--;
Line 41, "successively," should read --successively--;
Line 42, "and," should read --and--;
Line 51, "operations" should read --operations,--; and
Line 66, "sad" should be deleted.

COLUMN 25:

Line 12, "table," should read --table, and--.

COLUMN 26:

Line 10, "polynomial" should read --a polynomial--; and
Line 45, ",K j=1," should read --,K ; j=1,--.

COLUMN 27:

Line 44, "the" should be deleted.

COLUMN 28:

Line 29, "$x^n+1$," should read --$x^n+1$, and--; and
Line 65, "table;" should read --table; and--.

Signed and Sealed this

Seventeenth Day of July, 2007

JON W. DUDAS
*Director of the United States Patent and Trademark Office*